US012598883B2

(12) United States Patent
Kim et al.

(10) Patent No.: US 12,598,883 B2
(45) Date of Patent: Apr. 7, 2026

(54) DISPLAY APPARATUS INCLUDING TANDEM ORGANIC LIGHT-EMITTING DIODE

(71) Applicant: Samsung Display Co., Ltd., Yongin-si (KR)

(72) Inventors: Hyeongpil Kim, Yongin-si (KR); Byounghun Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 649 days.

(21) Appl. No.: 17/505,592

(22) Filed: Oct. 19, 2021

(65) Prior Publication Data

US 2022/0158113 A1 May 19, 2022

(30) Foreign Application Priority Data

Nov. 18, 2020 (KR) ........................ 10-2020-0154573

(51) Int. Cl.

| | |
|---|---|
| *H10K 59/32* | (2023.01) |
| *H10K 50/13* | (2023.01) |
| *H10K 50/17* | (2023.01) |
| *H10K 59/122* | (2023.01) |
| *H10K 59/38* | (2023.01) |
| *H10K 59/80* | (2023.01) |

(52) U.S. Cl.
CPC ........... *H10K 59/32* (2023.02); *H10K 50/131* (2023.02); *H10K 50/17* (2023.02); *H10K 59/122* (2023.02); *H10K 59/38* (2023.02); *H10K 59/877* (2023.02)

(58) Field of Classification Search
CPC .... H10K 50/131; H10K 59/122; H10K 59/38; H10K 59/32; H10K 59/877; H10K 50/17

USPC .................................................. 257/40, 59
See application file for complete search history.

(56) References Cited

U.S. PATENT DOCUMENTS

| | | | |
|---|---|---|---|
| 8,283,054 | B2 | 10/2012 | Spindler et al. |
| 8,791,454 | B2 | 7/2014 | Kim et al. |
| 10,714,540 | B2 | 7/2020 | Kim et al. |
| 10,756,274 | B2 | 8/2020 | Kim et al. |
| 11,302,875 | B2 | 4/2022 | Shin et al. |

(Continued)

FOREIGN PATENT DOCUMENTS

| | | |
|---|---|---|
| KR | 10-1475118 | 12/2014 |
| KR | 10-2017-0116301 | 10/2017 |

(Continued)

*Primary Examiner* — Eric W Jones
(74) *Attorney, Agent, or Firm* — Womble Bond Dickinson (US) LLP

(57) ABSTRACT

A display apparatus includes: a first organic light-emitting diode, a second organic light-emitting diode, and a third organic light-emitting diode corresponding to a first sub-pixel, a second sub-pixel, and a third sub-pixel, respectively; a first intermediate layer commonly provided in the first organic light-emitting diode and the second organic light-emitting diode, and comprising a first emission layer and a first n-type charge generation layer; a second intermediate layer provided in the third organic light-emitting diode, and comprising a second emission layer and a second n-type charge generation layer, wherein the first n-type charge generation layer includes a first material, and the second n-type charge generation layer includes a second material different from the first material.

19 Claims, 13 Drawing Sheets

(56)　　　　　References Cited

U.S. PATENT DOCUMENTS

| | | | | |
|---|---|---|---|---|
| 2006/0238119 A1* | 10/2006 | Spindler | .............. | H10K 85/624 |
| | | | | 313/506 |
| 2007/0090751 A1* | 4/2007 | Cok | ....................... | H10K 59/38 |
| | | | | 313/506 |
| 2007/0241675 A1* | 10/2007 | Kim | ....................... | H10K 50/19 |
| | | | | 428/917 |
| 2009/0195146 A1 | 8/2009 | Hatwar et al. | | |
| 2011/0095276 A1* | 4/2011 | Imai | ....................... | H10K 59/38 |
| | | | | 257/89 |
| 2014/0084256 A1* | 3/2014 | Kim | ....................... | H10K 59/32 |
| | | | | 257/40 |
| 2014/0197385 A1* | 7/2014 | Madigan | .............. | H10K 59/353 |
| | | | | 438/34 |
| 2014/0231790 A1* | 8/2014 | Fujino | .................... | H10K 59/38 |
| | | | | 257/89 |
| 2015/0028324 A1* | 1/2015 | Sagawa | ............... | H10K 50/824 |
| | | | | 257/40 |
| 2015/0270319 A1* | 9/2015 | Ishii | ........................ | H10K 59/38 |
| | | | | 257/40 |
| 2016/0111688 A1* | 4/2016 | Lee | ......................... | H10K 71/00 |
| | | | | 438/34 |
| 2018/0114939 A1* | 4/2018 | Oh | .......................... | H10K 50/19 |
| 2018/0210280 A1* | 7/2018 | Chen | .................. | H10K 50/8445 |
| 2019/0148458 A1* | 5/2019 | Kim | ..................... | H10K 50/115 |
| | | | | 257/89 |
| 2019/0157354 A1* | 5/2019 | Lee | ........................ | H01L 33/501 |
| 2019/0198573 A1* | 6/2019 | Kim | ...................... | H10K 59/38 |
| 2019/0296088 A1* | 9/2019 | Kim | ..................... | H10K 59/877 |
| 2020/0106025 A1* | 4/2020 | Shin | .................... | H10K 85/654 |
| 2020/0176531 A1* | 6/2020 | Baek | ....................... | H10K 59/35 |
| 2022/0037608 A1* | 2/2022 | Ichikawa | .............. | H10K 59/30 |

FOREIGN PATENT DOCUMENTS

| | | | |
|---|---|---|---|
| KR | 10-2019-0078906 A | 7/2019 |
| KR | 10-2020-0037654 A | 4/2020 |
| KR | 10-2020-0080683 | 7/2020 |

* cited by examiner

DISPLAY APPARATUS INCLUDING TANDEM ORGANIC LIGHT-EMITTING DIODE

CROSS-REFERENCE TO RELATED APPLICATIONS

This application claims priority from and the benefit of Korean Patent Application No. 10-2020-0154573, filed on Nov. 18, 2020, which is hereby incorporated by reference for all purposes as if fully set forth herein.

BACKGROUND

Field

Embodiments of the invention relate generally to display apparatuses.

Discussion of the Background

Display apparatuses visually display data. A display apparatus includes a substrate that is divided into a display area and a peripheral area in which an image is not capable of being displayed. In the display area, a scan line and a data line are insulated from each other, and a plurality of sub-pixels are included. In addition, a thin-film transistor and a sub-pixel electrode electrically connected to the thin-film transistor are provided in the display area to correspond to each of the sub-pixels. Furthermore, an opposite electrode commonly provided in the sub-pixels may be provided in the display area. The peripheral area may include various lines configured to transmit electrical signals to the display area, a scan driver, a data driver, a controller, a pad portion, and the like.

The usage of such display apparatuses has diversified. Accordingly, various designs have been attempted to improve the quality of display apparatuses.

The above information disclosed in this Background section is only for understanding of the background of the inventive concepts, and, therefore, it may contain information that does not constitute prior art.

SUMMARY

One or more embodiments include a display apparatus having a longer lifespan with reduced power consumption. However, these objectives are examples and do not limit the scope of the present disclosure.

Additional features of the inventive concepts will be set forth in the description which follows, and in part will be apparent from the description, or may be learned by practice of the inventive concepts.

According to an embodiment, a display apparatus including a first sub-pixel, a second sub-pixel, and a third sub-pixel emitting light of different colors includes a first organic light-emitting diode, a second organic light-emitting diode, and a third organic light-emitting diode arranged on a substrate and corresponding to the first sub-pixel, the second sub-pixel, and the third sub-pixel, respectively, a first intermediate layer commonly provided in the first organic light-emitting diode and the second organic light-emitting diode and including a first emission layer and a first charge generation layer, a second intermediate layer provided in the third organic light-emitting diode and including a second emission layer and a second charge generation layer, and a first color conversion layer, a second color conversion layer, and a transmission layer arranged to correspond to the first organic light-emitting diode, the second organic light-emitting diode, and the third organic light-emitting diode, respectively, wherein the first emission layer emits light of a different color from the second emission layer, the first charge generation layer includes a first material, and the second charge generation layer includes a second material different from the first material.

The first and charge generation layers may be n-type charge generation layers, and in the first n-type charge generation layer, a host may be doped with 0.5% to 20% of the first material, and in the second n-type charge generation layer, a host may be doped with 0.5% to 20% of the second material.

The second material may have a shallower work function than the first material.

Each of the first material and the second material may have a work function of 2.0 eV to 3.0 eV.

The first material may include at least one of ytterbium (Yb), calcium (Ca), terbium (Tb), and cerium (Ce), and the second material may include at least one of lithium (Li), potassium (K), rubidium (Rb), cesium (Cs), barium (Ba), europium (Eu), sodium (Na), strontium (Sr), and samarium (Sm).

The first emission layer may emit green light, and the second emission layer may emit blue light.

The display apparatus may further include a bank arranged on the substrate and arranged between the first emission layer and the second emission layer.

The bank may be arranged over an upper portion of a pixel-defining layer and may be arranged to surround the third organic light-emitting diode, wherein the upper portion of the pixel-defining layer defines an emission area of the first to third organic light-emitting diodes.

The second intermediate layer may further include a $(2\text{-}1)^{st}$ (second intermediate) emission layer above or below the second emission layer.

The first intermediate layer may include the $(2\text{-}1)^{st}$ (second intermediate) emission layer.

The $(2\text{-}1)^{st}$ (second intermediate) emission layer and the second emission layer may emit light of a same color.

The first intermediate layer may further include a $(1\text{-}1)^{st}$ (first intermediate) emission layer above or below the first emission layer, and the $(1\text{-}1)^{st}$ (first intermediate) emission layer and the first emission layer may emit light of a same color.

The display apparatus may further include a first color filter, a second color filter, and a third color filter corresponding to the first color conversion layer, the second color conversion layer, and the transmission layer, respectively.

A thickness of the transmission layer may be about 1 μm to about 12 μm, and a thickness of the third color filter may be about 0.5 μm to about 5 μm.

A thickness of the first color conversion layer and the second color conversion layer may be about 2 μm to about 18 μm.

The first color conversion layer may include first quantum dots, and a content of the first quantum dots in the first color conversion layer may be about 10% to about 60%.

The first color conversion layer may include scattering particles, and a content of the scattering particles in the first color conversion layer may be about 2% to about 10%.

The first organic light-emitting diode, the second organic light-emitting diode, and the third organic light-emitting diode may include a first sub-pixel electrode, a second sub-pixel electrode, and a third sub-pixel electrode, respectively.

The display apparatus may further include an opposite electrode commonly provided in the first organic light-emitting diode, the second organic light-emitting diode, and the third organic light-emitting diode.

According to another embodiment, a display apparatus including a first sub-pixel, a second sub-pixel, and a third sub-pixel emitting light of different colors includes a first organic light-emitting diode, a second organic light-emitting diode, and a third organic light-emitting diode arranged on a substrate and corresponding to the first sub-pixel, the second sub-pixel, and the third sub-pixel, respectively, a first intermediate layer commonly provided in the first organic light-emitting diode and the second organic light-emitting diode and including a first emission layer and a first n-type charge generation layer, a second intermediate layer provided in the third organic light-emitting diode, the second intermediate layer including a second emission layer emitting light of a different color from the first emission layer, and a second n-type charge generation layer, and a bank arranged to at least partially surround the second intermediate layer.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
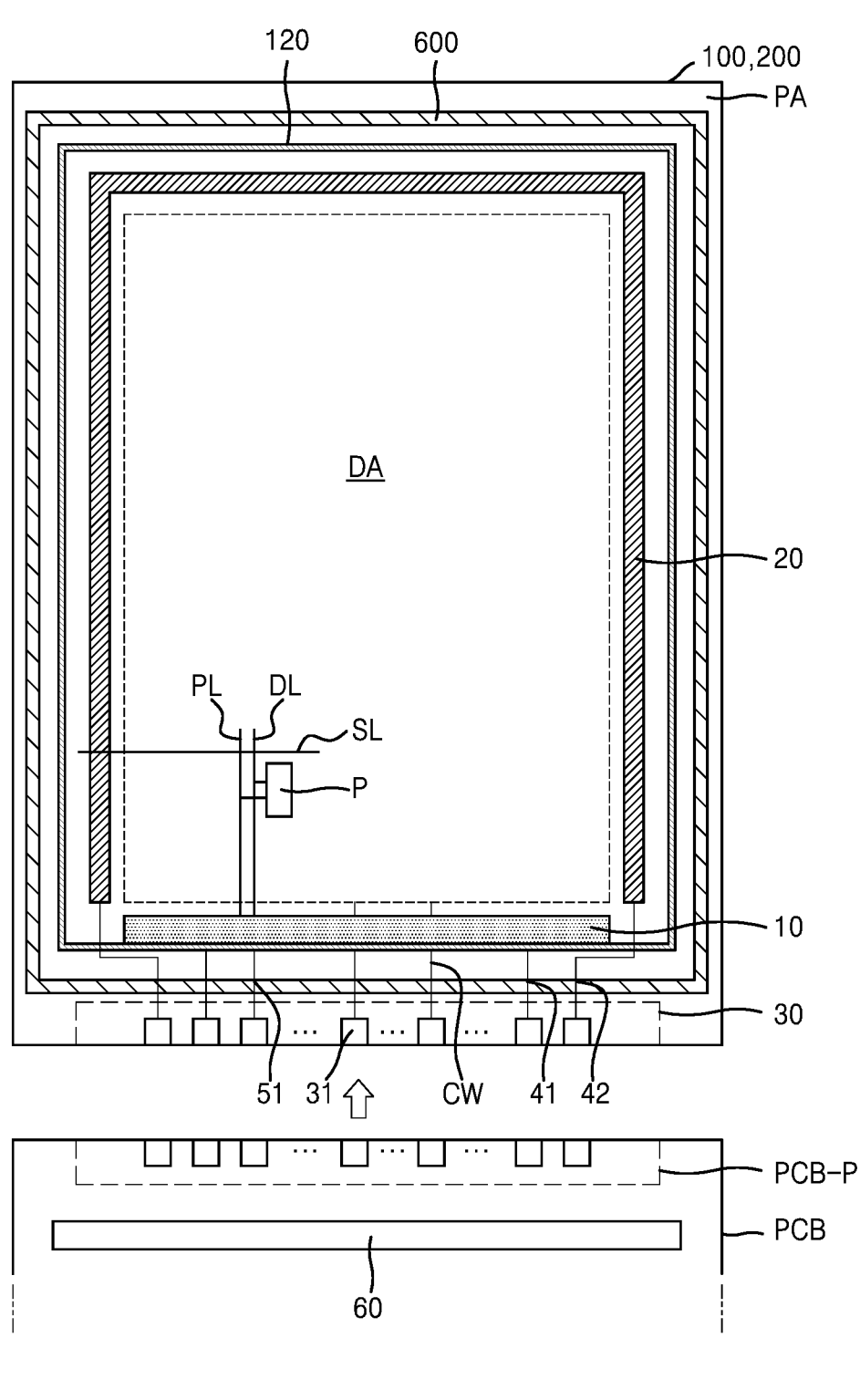
FIGS. 1A and 1B are plan views schematically illustrating a display apparatus according to one or more embodiments that has been constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Display apparatuses display an image, and for example, may be organic light-emitting display apparatuses, inorganic light-emitting display apparatuses, quantum dot light-emitting display apparatuses, and the like.

In the following description, an organic light-emitting display apparatus is described as an example of a display apparatus according to an embodiment. However, a display apparatus of the present disclosure is not limited thereto, and display apparatuses of various types may be used.

Figure 1B:
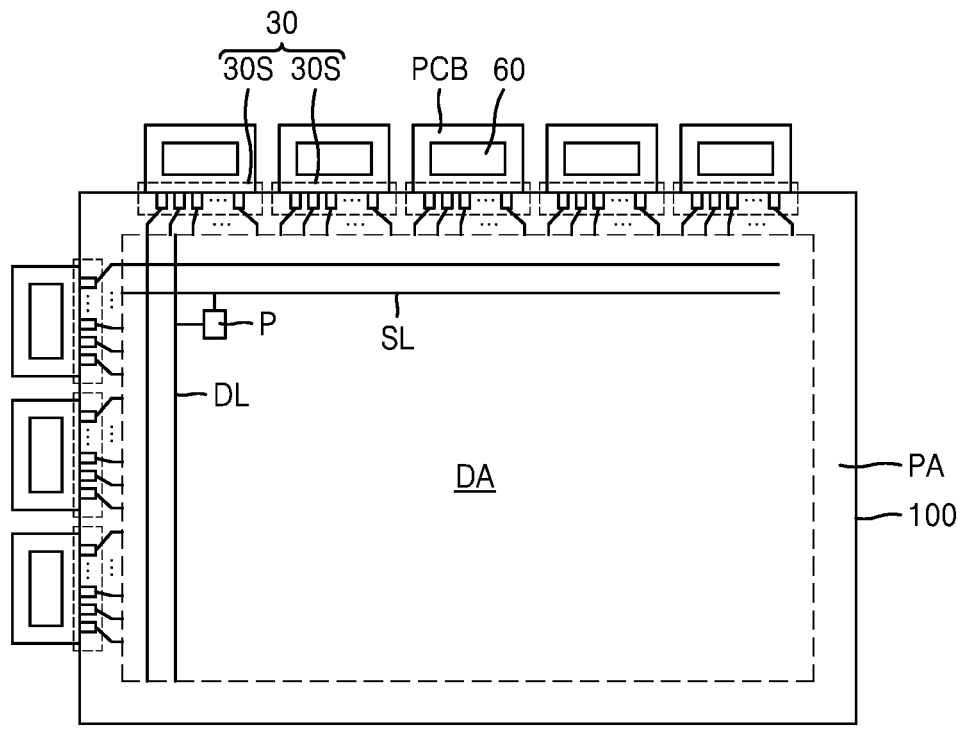

FIGS. 1A and 1B are plan views schematically illustrating a display apparatus according to one or more embodiments that has been constructed according to principles of the invention.

Referring to FIG. 1A, the display apparatus may be formed by bonding a substrate 100 and an upper substrate 200 to each other by a sealing member 600. The sealing member 600 may be formed to surround an outer periphery surface of the substrate 100 and the upper substrate 200 to bond the substrate 100 and the upper substrate 200 together.

The display apparatus may include a display area DA and a peripheral area PA around the display area DA. The display apparatus may provide an image using light emitted from a plurality of sub-pixels arranged in the display area DA.

The display area DA may include sub-pixels P that are connected to a data line DL extending in an x direction and a scan line SL extending in a y direction orthogonal to or substantially orthogonal to the x direction. Each of the sub-pixels P may also be connected to a driving voltage line PL extending in the x direction.

Each of the sub-pixels P may include a display element such as an organic light-emitting diode (OLED). Each of the sub-pixels P may emit red, green, blue, or white light, for example, through the organic light-emitting diode (OLED). In some embodiments, independent of a color of light emitted from the organic light-emitting diode (OLED) included in the sub-pixels P, a color of each sub-pixel P may be implemented by a color filter or the like arranged above the organic light-emitting diode (OLED).

Each of the sub-pixels P may be electrically connected to internal circuits arranged in the peripheral area PA. A first power supply line 10, a second power supply line 20, and a pad portion 30 may be arranged in the peripheral area PA.

The first power supply line 10 may be arranged to correspond to one side of the display area DA. The first power supply line 10 may be connected to the driving voltage lines PL configured to transmit a driving voltage ELVDD (see FIGS. 2A and 2B) to the sub-pixels P.

The second power supply line 20 may partially surround the display area DA in a loop shape with one side open. The second power supply line 20 may be configured to apply a common voltage to an opposite electrode of the sub-pixel P. The second power supply line 20 may also be referred to as a common voltage supply line.

The pad portion 30 includes pads 31 and may be arranged at one side of the substrate 100. Each of the pads 31 may be connected to a first connection line 41 connected to the first power supply line 10, a connection line CW extending to the display area DA, or the like. The pads 31 of the pad portion 30 are exposed without being covered with an insulating layer, and may be electrically connected to a printed circuit board PCB. A PCB terminal portion PCB—P of the printed circuit board PCB may be electrically connected to the pad portion 30.

The printed circuit board PCB transmits a signal or power from a controller to the pad portion 30. The controller may respectively provide the driving voltage ELVDD and a common voltage ELVSS (see FIGS. 2A and 2B) to the first power supply line 10 and the second power supply line 20, respectively through the first connection line 41 and a second connection line 42.

A data driving circuit 60 is electrically connected to the data line DL. A data signal of the data driving circuit 60 may be provided to each of the sub-pixels P through the connection line CW connected to the pad portion 30 and the data line DL connected to the connection line CW. Although FIG. 1A shows that the data driving circuit 60 is arranged on the printed circuit board PCB, in an embodiment, the data driving circuit 60 may be arranged on the substrate 100. For example, the data driving circuit 60 may be arranged between the pad portion 30 and the first power supply line 10.

A dam portion 120 may be arranged in the peripheral area PA. When forming an organic encapsulation layer 420 (see FIG. 4) of a thin-film encapsulation layer 400 (see FIG. 4), the dam portion 120 may block an organic material from flowing in an edge direction of the substrate 100 and prevent an edge tail of the organic encapsulation layer 420 from being formed. In the peripheral area PA, the dam portion 120 may at least partially surround the display area DA. The dam portion 120 may include a plurality of dams, and in this case, the dams may be spaced apart from each other. In the peripheral area PA, the dam portion 120 may be closer to the display area DA than the sealing member 600. The peripheral area PA may further include an internal driving circuit portion (not shown) that provides a scan signal to each sub-pixel P. In an embodiment, the internal driving circuit portion and the dam portion 120 may overlap each other.

FIG. 1A shows that one printed circuit board PCB is attached to the pad portion 30, but a plurality of printed circuit boards PCB may be attached to the pad portion 30 as shown in FIG. 1B.

In addition, the pad portion 30 may be arranged along two sides of the substrate 100. The pad portion 30 may include a plurality of sub-pad portions 30S, and one printed circuit board PCB may be attached for each of the sub-pad portions 30S.

Figure 2A:
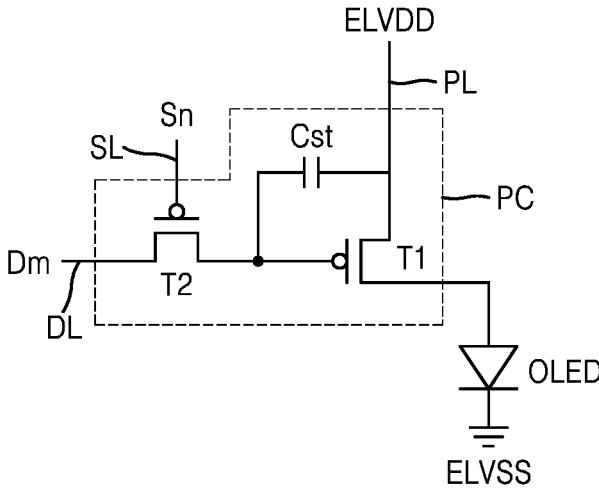
FIGS. 2A and 2B are equivalent circuit diagrams of a sub-pixel of a display apparatus according to an embodiment.
Figure 2B:
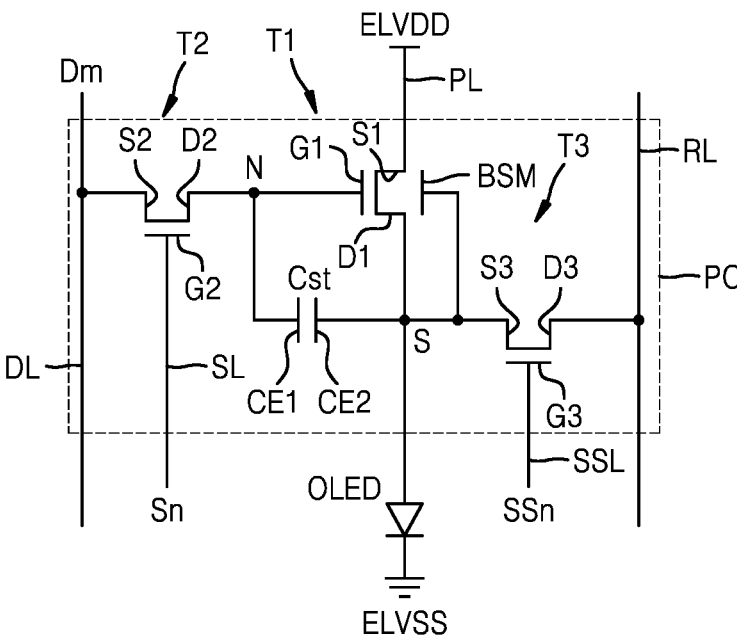

FIGS. 2A and 2B are equivalent circuit diagrams of a sub-pixel of a display apparatus according to an embodiment.

Referring to FIG. 2A, each sub-pixel P (see FIG. 1A) may be implemented by a pixel circuit PC connected to a scan line SL and a data line DL, and an organic light-emitting diode OLED connected to the pixel circuit PC. The pixel circuit PC may include a driving thin-film transistor T1, a switching thin-film transistor T2, and a storage capacitor Cst. The switching thin-film transistor T2 is connected to the scan line SL and the data line DL and may transmit a data signal Dm received via the data line DL to the driving thin-film transistor T1 according to a scan signal Sn received via the scan line SL.

The storage capacitor Cst is connected to the switching thin-film transistor T2 and a driving voltage line PL and may be configured to store a voltage corresponding to a voltage difference between a voltage received via the switching thin-film transistor T2 and the first power supply voltage ELVDD (or a driving voltage) applied to the driving voltage line PL.

The driving thin-film transistor T1 is connected to the driving voltage line PL and the storage capacitor Cst and may control a driving current flowing from the driving voltage line PL to the organic light-emitting diode OLED corresponding to the voltage stored in the storage capacitor Cst. The organic light-emitting diode OLED may emit light having a luminance according to the driving current.

In FIG. 2A, the pixel circuit PC includes two thin-film transistors and one storage capacitor, but the present disclosure is not limited thereto.

Referring to FIG. 2B, a pixel circuit PC may include a driving thin-film transistor T1, a switching thin-film transistor T2, a sensing thin-film transistor T3, and a storage capacitor Cst.

A scan line SL may be connected to a gate electrode G2 of the switching thin-film transistor T2, a data line DL may be connected to a source electrode S2 of the switching thin-film transistor T2, and a first electrode CE1 of the storage capacitor Cst may be connected to a drain electrode D2 of the switching thin-film transistor T2.

Accordingly, the switching thin-film transistor T2 may apply a data voltage of the data line DL to a first node N in response to a scan signal Sn received from the scan line SL of each sub-pixel P.

A gate electrode G1 of the driving thin-film transistor T1 may be connected to the first node N, a source electrode S1 of the driving thin-film transistor T1 may be connected to the driving voltage line PL for transmitting a driving voltage ELVDD, and a drain electrode D1 of the driving thin-film transistor T1 may be connected to an anode electrode of an organic light-emitting diode OLED.

Thus, the driving thin-film transistor T1 may control a current flowing through the organic light-emitting diode OLED according to a source-gate voltage Vgs thereof, that is, a voltage applied between the driving voltage ELVDD and the first node N.

A sensing control line SSL may be connected to a gate electrode G3 of the sensing thin-film transistor T3, a source electrode S3 of the sensing thin-film transistor T3 may be connected to a second node S, and a drain electrode D3 of the sensing thin-film transistor T3 may be connected to a reference voltage line RL. In an embodiment, the sensing thin-film transistor T3 may be controlled by the scan line SL instead of the sensing control line SSL.

The sensing thin-film transistor T3 may sense a potential of a sub-pixel electrode (e.g., an anode electrode) of the organic light-emitting diode OLED. The sensing thin-film transistor T3 may apply a pre-charging voltage received via the reference voltage line RL to the second node S in response to a sensing signal SSn received via the sensing control line SSL, or may apply a voltage of the sub-pixel electrode (for example, the anode electrode) of the organic light-emitting diode OLED to the reference voltage line RL during a sensing period.

The first electrode CE1 of the storage capacitor Cst may be connected to the first node N, and a second electrode CE2 of the storage capacitor Cst may be connected to the second node S. The storage capacitor Cst may charge a voltage difference between voltages respectively applied to the first node N and the second node S, and supply the charged voltage as a driving voltage of the driving thin-film transistor T1. For example, the storage capacitor Cst may charge a voltage difference between a data voltage Dm and a precharging voltage Vpre respectively applied to the first node N and the second node S.

A bias electrode BSM may be formed to correspond to the driving thin-film transistor T1, and connected to the source electrode S3 of the sensing thin-film transistor T3. The bias electrode BSM receives a voltage in connection with a potential of the source electrode S3 of the sensing thin-film transistor T3, and thus, the driving thin-film transistor T1 may be stabilized. In an embodiment, the bias electrode BSM may not be connected to the source electrode S3 of the sensing thin-film transistor T3, but may be connected to a separate bias line.

An opposite electrode (for example, a cathode electrode) of the organic light-emitting diode OLED may receive a common voltage ELVSS. The organic light-emitting diode OLED may receive a driving current from the driving thin-film transistor T1 to emit light.

In FIG. 2B, each of the sub-pixels P (see FIG. 1A) includes the scan line SL, the sensing control line SSL, the data line DL, the reference voltage line RL, and a driving voltage line PL, the present disclosure is not limited thereto. For example, at least one of the scan line SL, the sensing control line SSL, the data line DL, and/or the reference voltage line RL, and the driving voltage line PL may be shared with neighboring sub-pixels.

The pixel circuit PC is not limited to the number of thin-film transistors and storage capacitors and the circuit design described with reference to FIGS. 2A and 2B, and various modifications to the number and circuit design thereof is possible.

Figure 3:
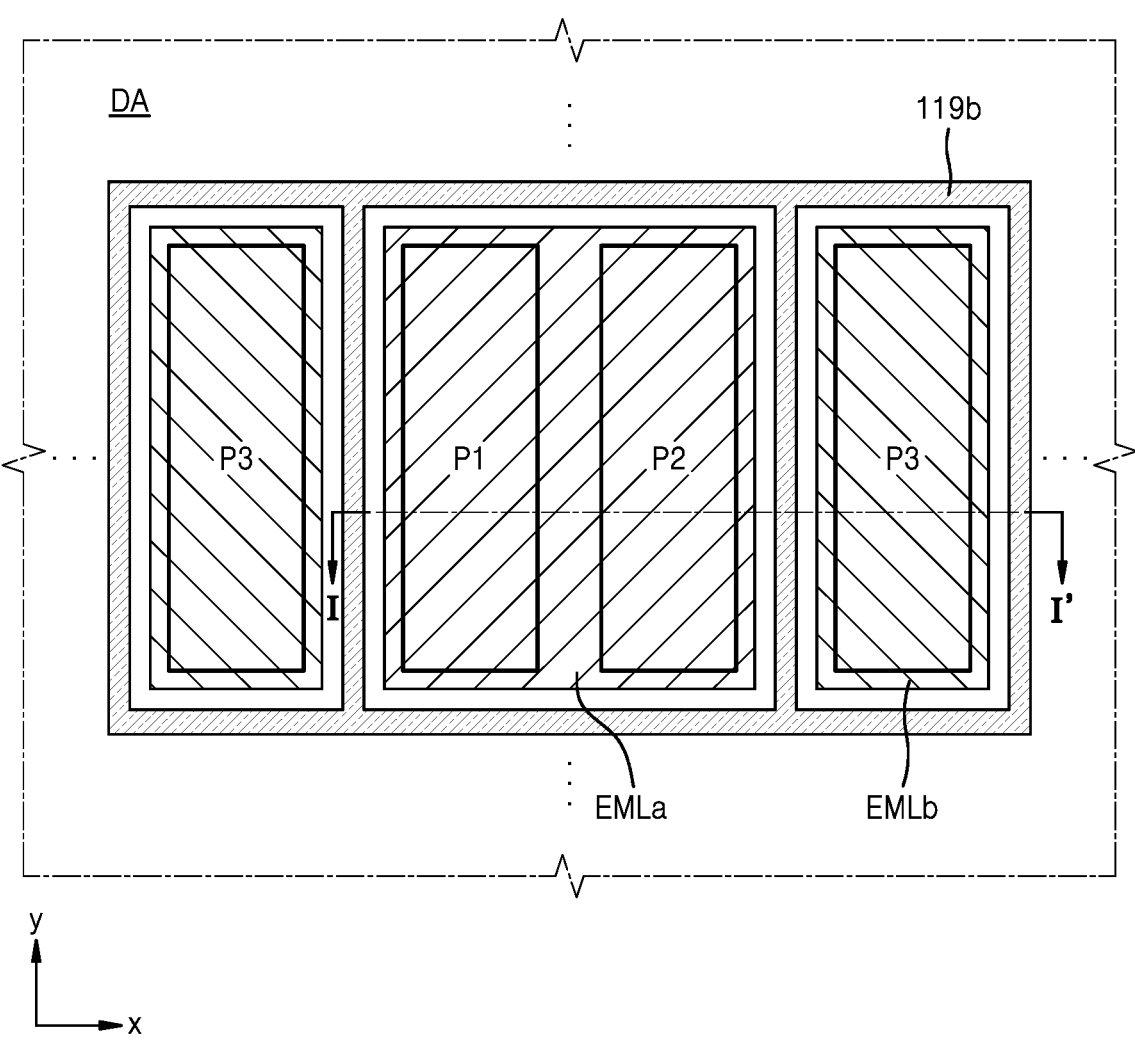
FIG. 3 is a plan view schematically illustrating part of a display apparatus according to an embodiment.

FIG. 3 is a plan view schematically illustrating part of a display apparatus according to an embodiment.

In FIG. 3, a first sub-pixel P1, a second sub-pixel P2, and a third sub-pixel P3 are sequentially arranged in an x direction in a stripe arrangement, but the present disclosure is not limited thereto. The first sub-pixel P1, the second sub-pixel P2, and the third sub-pixel P3 may be arranged in various ways, for example, in a pentile matrix arrangement, a mosaic arrangement, a delta arrangement, and the like.

In an embodiment, a first emission layer EMLa may be arranged in the first sub-pixel P1 area and the second sub-pixel P2 area, and a second emission layer EMLb may be arranged in the third sub-pixel P3 area. In other words, an emission layer arranged in an area in which the first sub-pixel P1 and the second sub-pixel P2 are arranged may differ from an emission layer arranged in an area in which the third sub-pixel P3 is arranged. The emission layer will be described later below.

A bank 119b may be arranged to separate the area where the first sub-pixel P1 and the second sub-pixel P2 are arranged from the area where the third sub-pixel P3 is arranged. The bank 119b may be arranged between the first sub-pixel P1 and the third sub-pixel P3 and between the second sub-pixel P2 and the third sub-pixel P3. In an embodiment, the bank 119b may surround at least a portion of the third sub-pixel P3. The bank 119b is not arranged between the first sub-pixel P1 and the second sub-pixel P2, but may surround at least a portion of the first sub-pixel P1 and the second sub-pixel P2.

Figure 4:
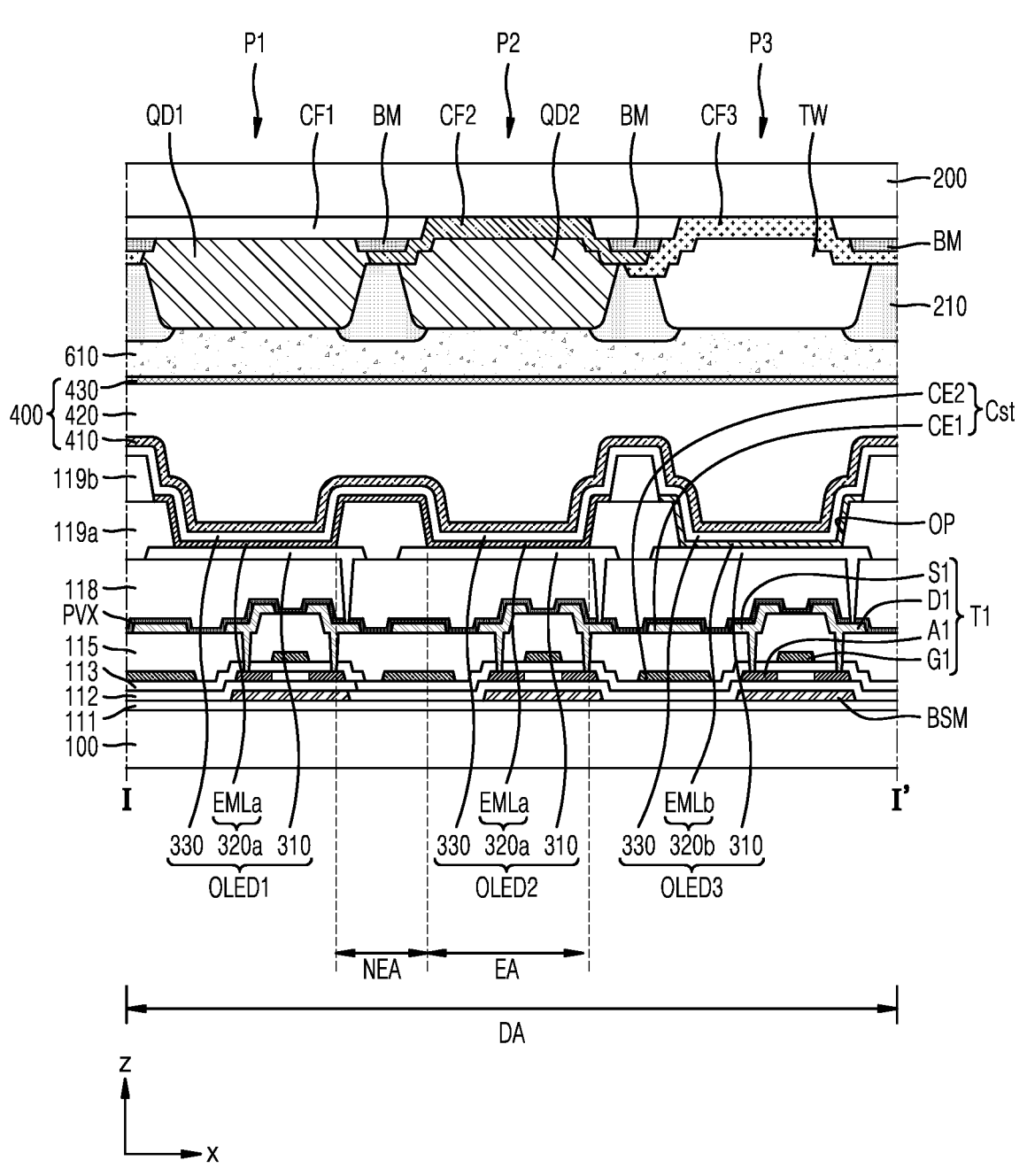
FIG. 4 is a cross-sectional view schematically illustrating part of a display apparatus according to one or more embodiments.

FIG. 4 is a cross-sectional view schematically illustrating part of a display apparatus according to one or more embodiments. FIG. 4 may correspond to line I-I' in FIG. 3.

Referring to FIG. 4, at least one thin-film transistor T1 and a display element connected to the at least one thin-film transistor T1 may be arranged in a display area DA of the display apparatus according to an embodiment. In the display area of FIG. 4, the driving thin-film transistor T1 and the storage capacitor Cst of the pixel circuit PC described with reference to FIGS. 2A and 2B are shown.

The display area DA of the display apparatus includes first, second, and third sub-pixels P1, P2, and P3, each of which may include an emission area EA. The emission area EA may be an area where light is generated and emitted to the outside. A non-emission area NEA may be arranged between each emission area EA, and the emission areas EA of the first, second, and third sub-pixels P1, P2, and P3 may be distinguished by the non-emission area NEA.

In an embodiment, the display apparatus may include a color conversion layer corresponding to at least one sub-pixel. For example, as shown in FIG. 4, a first color conversion layer QD1 and a second color conversion layer QD2 may be arranged to correspond to the first sub-pixel P1 and the second sub-pixel P2, respectively. Each of the first and second color conversion layers QD1 and QD2 may include quantum dots and scattering particles.

Also, no color conversion layer corresponds to the emission area EA of the third sub-pixel P3, but a transmission layer TW may be arranged in the emission area EA of the third sub-pixel P3. The transmission layer TW may include an organic material capable of emitting light without converting a wavelength of light emitted from a third organic light-emitting diode OLED3 of the third sub-pixel P3.

In an embodiment, a first organic light-emitting diode OLED1 and a second organic light-emitting diode OLED2 respectively included in the first sub-pixel P1 and the second sub-pixel P2 may emit light of a same color. The third organic light-emitting diode OLED3 included in the third sub-pixel P3 may emit light of a color different from the color of light emitted from the first organic light-emitting diode OLED1 included in the first sub-pixel P1 and the second organic light-emitting diode OLED2 included in the second sub-pixel P2.

Hereinafter, for convenience of explanation, the elements arranged in the display area DA of FIG. 4 will be described according to a stacked order.

The substrate 100 may include a glass material, a ceramic material, a metal material, or a material that is flexible or bendable. When the substrate 100 is flexible or bendable, the substrate 100 may include a polymer resin such as polyether sulfone, polyacrylate, polyether imide, polyethylene naphthalate, polyethylene terephthalide, polyphenylene sulfide, polyarylate, polyimide, polycarbonate, or cellulose acetate propionate. The substrate 100 may have a single layer or a multi-layer structure of the above material, and for a multi-layer structure, may further include an inorganic layer. In some embodiments, the substrate 100 may have a structure of an organic material, an inorganic material, and another organic material.

A first buffer layer 111 may be arranged on the substrate 100. The first buffer layer 111 may be located on the substrate 100 and reduce or block the penetration of foreign materials, moisture, or ambient air into a lower portion of the substrate 100, and may provide a flat surface on the substrate 100. In an embodiment, the first buffer layer 111 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO$). For example, the first buffer layer 111 may include silicon oxide ($SiO_2$) or silicon nitride ($SiN_x$).

A barrier layer (not shown) may be further included between the substrate 100 and the first buffer layer 111. The barrier layer may prevent or reduce impurities from the substrate 100 and the like from penetrating into a semiconductor layer A1. The barrier layer may include an inorganic material such as an oxide or a nitride, or may include an organic material, or may include an organic/inorganic composite material, and may have a single layer or a multi-layer structure of an inorganic material and an organic material.

A bias electrode BSM may be arranged on the first buffer layer 111 to correspond to the driving thin-film transistor T1. A voltage may be applied to the bias electrode BSM. For example, the bias electrode BSM may be connected to the source electrode S3 (see FIG. 2B) of the sensing thin-film transistor T3 (see FIG. 2B) to receive voltage of the source electrode S3. In addition, the bias electrode BSM may prevent external light from reaching the semiconductor layer A1. Thus, the characteristics of the driving thin-film transistor T1 may be stabilized. In some cases, the bias electrode BSM may be omitted.

A second buffer layer 112 may be arranged on the bias electrode BSM. The second buffer layer 112 and the first buffer layer 111 may include a same material. In some embodiments, the second buffer layer 112 and the first buffer layer 111 may include different materials from each other.

The semiconductor layer A1 may be arranged on the second buffer layer 112. The semiconductor layer A1 may include amorphous silicon or polysilicon. In an embodiment, the semiconductor layer A1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the semiconductor layer A1 may include a Zn oxide-based material, such as a Zn oxide, an In—Zn oxide, and a Ga—In—Zn oxide. In another embodiment, the semiconductor layer A1 may include In—Ga—Zn—O (IGZO), In—Sn—Zn—O (ITZO), or In—Ga—Sn—Zn—O (IG-TZO) semiconductor, in which a metal such as indium (In), gallium (Ga), or stannum (Sn) is included in zinc oxide (ZnO). The semiconductor layer A1 may include a channel area, a source area, and a drain area, wherein the source area and the drain area are arranged at opposite sides of the channel area, respectively. The semiconductor layer A1 may include a single layer or multiple layers.

A gate insulating layer 113 may be arranged on the semiconductor layer A1. The gate insulating layer 113 may include an inorganic insulating material such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO).

A gate electrode G1 may be arranged on the semiconductor layer A1 with the gate insulating layer 113 therebetween, so as to at least partially overlap the semiconductor layer A1. The gate electrode G1 may include molybdenum (Mo), aluminum (Al), copper (Cu), titanium (Ti), etc., and may include a single layer or multiple layers. In an embodiment, the gate electrode G1 may include a single Mo layer. A first electrode CE1 of a storage capacitor Cst and the gate electrode G1 may be arranged on a same layer. The first electrode CE1 and the gate electrode G1 may include a same material. In an embodiment, the first electrode CE1 and the gate electrode G1 may be provided as a single body.

An interlayer insulating layer 115 may be arranged on the gate electrode G1 and the first electrode CE1. The interlayer insulating layer 115 may include an inorganic insulating material such as silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO).

The source electrode S1, the drain electrode D1, a data line DL (not shown), and a second electrode CE2 of the storage capacitor Cst may be arranged on the interlayer insulating layer 115.

Each of the source electrode S1, the drain electrode D1, the data line, and the second electrode CE2 of the storage capacitor Cst may include a conductive material including molybdenum (Mo), aluminum (Al), copper (Cu), titanium (Ti), etc., and may include a single layer or multiple layers including the above material. In an embodiment, each of the source electrode S1, the drain electrode D1, the data line DL, and the second electrode CE2 may have a multi-layer structure of a Ti layer, an Al layer, and another Ti layer. The source electrode S1 and the drain electrode D1 may be respectively connected to the source area and the drain area of the semiconductor layer A1 through a contact hole.

The second electrode CE2 of the storage capacitor Cst may overlap the first electrode CE1 with the interlayer insulating layer 115 therebetween. Thus, the first electrode CE1 and the second electrode CE2 may form a capacitance. In this case, the interlayer insulating layer 115 may function as a dielectric layer of the storage capacitor Cst.

The source electrode S1, the drain electrode D1, the data line, and the second electrode CE2 of the storage capacitor Cst may be covered with an inorganic protective layer PVX.

The inorganic protective layer PVX may be a single film or multiple films including silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). The inorganic protective layer PVX may be introduced to cover and protect some lines arranged on the interlayer insulating layer 115. Lines (not shown) formed together in a same process as the data line may be exposed in a portion of the substrate 100 (e.g., a portion of a peripheral area). An exposed portion of the lines may be damaged by an etchant used to pattern a sub-pixel electrode 310 to be described below, but because the inorganic protective layer PVX may cover the data line and at least a portion of the lines formed together with the data line DL, the lines may be prevented from being damaged in the patterning process of the sub-pixel electrode 310.

A planarization layer 118 may be arranged on the inorganic protective layer PVX, and a first organic light-emitting diode OLED1, a second organic light-emitting diode OLED2, and the third organic light-emitting diode OLED3 may be arranged on the planarization layer 118.

The planarization layer 118 may be formed as a single layer or multiple layers including an organic material and may provide a flat upper surface. The planarization layer 118 may include a general-purpose polymer (for example, benzocyclobutene, polyimide, hexamethyldisiloxane, polymethylmethacrylate, or polystyrene), a polymer derivative having a phenol-based group, an acryl-based polymer, an imide-based polymer, an aryl-ether-based polymer, an amide-based polymer, a fluorine-based polymer, a p-xylene-based polymer, a vinyl-alcohol-based polymer, and any blends thereof.

In the display area DA of the substrate 100, the first organic light-emitting diode OLED1, the second organic light-emitting diode OLED2, and the third organic light-emitting diode OLED3 may be arranged on the planarization layer 118. The first organic light-emitting diode OLED1 may be arranged in the first sub-pixel P1 area, the second organic light-emitting diode OLED2 may be arranged in the second sub-pixel P2 area, and the third organic light-emitting diode OLED3 may be arranged in the third sub-pixel P3 area. Each of the first organic light-emitting diode OLED1, the second organic light-emitting diode OLED2, and the third organic light-emitting diode OLED3 may include a sub-pixel electrode 310, an intermediate layer including an emission layer, and an opposite electrode 330.

The sub-pixel electrode 310 may be arranged on the planarization layer 118. In an embodiment, the sub-pixel electrode 310 may be patterned and formed to correspond to each of the first, second, and third organic light-emitting diodes OLED1, OLED2, and OLED3. The sub-pixel electrode 310 may be electrically connected to a pixel circuit PC (see FIG. 2B).

The pixel electrode 310 may be a (semi-)light-transmitting electrode or a reflective electrode. In some embodiments, the sub-pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compounds thereof, and a transparent or translucent electrode layer formed on the reflective layer. The transparent or translucent electrode layer may include at least one material selected from the group consisting of indium tin oxide (ITO), indium zinc oxide (IZO), zinc oxide (ZnO), indium oxide (In$_2$O$_3$), indium gallium oxide (IGO), and aluminum zinc oxide (AZO). In an embodiment, the sub-pixel electrode 310 may be provided as an ITO layer, an Ag layer, and another ITO layer.

A pixel-defining layer 119a may be arranged on the planarization layer 118, and the pixel-defining layer may have an opening corresponding to each of the sub-pixels in the display area DA, that is, an opening OP exposing at least a portion of the sub-pixel electrode 310, thereby defining the emission areas EA of the first, second, and third sub-pixels P1, P2, and P3. For example, the pixel-defining layer 119a may have the opening OP through which at least a portion of a central portion of the sub-pixel electrode 310 is exposed. In addition, the pixel-defining layer 119a may prevent an arc, etc. from occurring at an edge of the sub-pixel electrode 310 by increasing a distance between the edge of the sub-pixel electrode 310 and the opposite electrode 330 above the sub-pixel electrode 310.

The pixel-defining layer 119a may include at least one organic insulating material selected from the group consisting of polyimide, polyamide, an acryl-based resin, benzocyclobutene, and a phenol resin, and may be formed by spin coating, etc.

Each of the first organic light-emitting diode OLED1 and the second organic light-emitting diode OLED2 includes a first intermediate layer 320a, and the first intermediate layer 320a may include a first emission layer EMLa. The third organic light-emitting diode OLED3 includes a second intermediate layer 320b, and the second intermediate layer 320b may include a second emission layer EMLb. In the first organic light-emitting diode OLED1, the second organic light-emitting diode OLED2, and the third organic light-emitting diode OLED3, a functional layer such as a hole injection layer (HIL), a hole transport layer (HTL), an electron transport layer (ETL), an electron injection layer (EIL), and the like may be selectively further arranged below and above the first and second emission layers EMLa and EMLb.

In an embodiment, the first organic light-emitting diode OLED1 and the second organic light-emitting diode OLED2 may commonly include the first emission layer EMLa, and the third organic light-emitting diode OLED3 may include the second emission layer EMLb.

The first emission layer EMLa and the second emission layer EMLb may emit light of different colors from each other. In an embodiment, the first emission layer EMLa may include an organic material emitting green light, and the second emission layer EMLb may include an organic material emitting blue light. The first emission layer EMLa may be formed by using, for example, a green dopant in a host material. For example, the first emission layer EMLa may include a phosphorescent host material such as Tris(4-carbazoyl-9-ylphenyl)amine (TCTA), 4,4'-Bis(N-carbazolyl)-1,1'-biphenyl (CBP), Bis(8-hydroxy-2-methylquinoline)-(4-phenylphenoxy)aluminum (BAlq), Poly(p phenylene vinylene) (PPV), and the like. In addition, the first emission layer EMLa may be doped with a phosphorescent dopant such as Ir(ppy)$_3$ or Ir(mmapy)$_3$.

The second emission layer EMLb may be formed by using, for example, a blue dopant in a host material. For example, the second emission layer EMLb includes a host material including CBP or mCP, and may include a phosphorescent material including a dopant material including (4,6-F2ppy)2Irpic. In contrast, the second emission layer EMLb may include a fluorescent material including any one selected from the group consisting of spiro-DPVBi, spiro- 6P, distill benzene (DSB), distrylarylene (DSA), a PFO-based polymer, and a PPV-based polymer, but is not limited thereto.

In an embodiment, a color of light ultimately emitted by the first sub-pixel P1, the second sub-pixel P2, and the third sub-pixel P3 is a color seen from the outside of an upper substrate 200, and thus, when a same emission layer is applied to the first organic light-emitting diode OLED1, the second organic light-emitting diode OLED2, and the third organic light-emitting diode OLED3, a voltage applied to the first organic light-emitting diode OLED1, the second organic light-emitting diode OLED2, and the third organic light-emitting diode OLED3 may vary depending on light emission efficiencies of the first color conversion layer QD1 and the second color conversion layer QD2.

For example, when a blue emission layer is applied to all of the first organic light-emitting diode OLED1, the second organic light-emitting diode OLED2, and the third organic light-emitting diode OLED3, light conversion may be performed on the first sub-pixel P1 and the second sub-pixel P emitting red light or green light so as to produce a same luminance as the third sub-pixel P3 emitting blue light, thus increasing a driving voltage applied to the first organic light-emitting diode OLED1 and the second organic light-emitting diode OLED2. Therefore, the power consumption may rapidly increase while the lifespan of the first and second organic light-emitting diode OLED1 and OLED2 may be reduced.

In an embodiment, considering this light conversion efficiency, the first emission layer EMLa may be employed for the first organic light-emitting diode OLED1 and the second organic light-emitting diode OLED2, and the second emission layer EMLb emitting light of a different color from the first emission layer EMLa may be employed, to thereby reduce power consumption and enhance efficiency. In an embodiment, the first emission layer EMLa may emit green light, and the second emission layer EMLb may emit blue light.

The opposite electrode 330 may be a cathode that is an electron injection electrode, and in this case, a metal, an alloy, an electrically conductive compound, or any combinations thereof having a low work function may be used as a material for the opposite electrode 330. The opposite electrode 330 may be a transmissive electrode, a semi-transmissive electrode, or a reflective electrode. The opposite electrode 330 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combinations thereof. The opposite electrode 330 may have a single layer structure that is a single layer, or a multi-layer structure having a plurality of layers.

The opposite electrode 330 may be arranged over the display area DA and the peripheral area PA (see FIG. 1A) and may be arranged above the intermediate layer and the pixel-defining layer 119a. The opposite electrode 330 may be formed as a single body with the first, second, and third organic light-emitting diodes OLED1, OLED2, and OLED3 so as to overlap the plurality of sub-pixel electrodes 310.

A bank 119b may be arranged on the pixel-defining layer 119a. The bank 119b may be formed as a single body with pixel-defining layer 119a. For example, the bank 119b and the pixel-defining layer 119a may be formed simultaneously in a same process using a half tone mask process. In an embodiment, the bank 119b may include a liquid repellent material.

The bank 119$b$ may be a structure for separating the first emission layers EMLa and the second emission layer EMLb from each other. The bank 119$b$ may be arranged between the first organic light-emitting diode OLED1 and the third organic light-emitting diode OLED3 and between the second organic light-emitting diode OLED2 and the third organic light-emitting diode OLED3. Because the first organic light-emitting diode OLED1 and the second organic light-emitting diode OLED2 have the first emission layer EMLa in common, the bank 119$b$ may not be arranged between the first organic light-emitting diode OLED1 and the second organic light-emitting diode OLED2.

The first organic light-emitting diode OLED1, the second organic light-emitting diode OLED2, and the third organic light-emitting diode OLED3 may be covered with a thin-film encapsulation layer 400 because they may be easily damaged by moisture or oxygen from the outside. The thin-film encapsulation layer 400 may cover the display area DA and extend out of the display area DA. The thin-film encapsulation layer 400 may include at least one organic layer and at least one inorganic layer. For example, the thin-film encapsulation layer 400 may include a first inorganic layer 410, an organic layer 420, and a second inorganic layer 430.

For example, the first inorganic layer 410 may cover the opposite electrode 330 and may include silicon oxide ($SiO_2$), silicon nitride ($SiN_X$), silicon oxynitride ($SiO_XN_Y$), aluminum oxide ($Al_2O_3$), titanium oxide ($TiO_2$), tantalum oxide ($Ta_2O_5$), hafnium oxide ($HfO_2$), or zinc oxide (ZnO). Although not shown, other layers such as a capping layer and the like may be located between the first inorganic layer 410 and the opposite electrode 330 when necessary. Because the first inorganic layer 410 is formed along an underlying structure thereof, an upper surface of the first inorganic layer 410 may not be flat. The organic layer 420 may cover the first inorganic layer 410 and may have a substantially flat upper surface unlike the first inorganic layer 410. For example, the organic layer 420 may have a substantially flat upper surface in a portion thereof corresponding to the display area DA. The organic layer 420 may include one or more materials selected from the group consisting of polyethylene terephthalate, polyethylene naphthalate, polycarbonate, polyimide, polyethylene sulfonate, polyoxymethylene, polyarylate, and hexamethyldisiloxane. The second inorganic layer 430 covers the organic layer 420, and the second inorganic layer 430 and the organic layer 420 may include a same material or different materials from each other.

Through the aforementioned multi-layer structure, even when cracks occur in the thin-film encapsulation layer 400, those cracks may be prevented from connecting between the first inorganic layer 410 and the organic layer 420 or between the organic layer 420 and the second inorganic layer 430. Therefore, the formation of a passage through which external moisture or oxygen penetrate into the display area DA may be prevented or reduced.

A filler 610 may be arranged above the thin-film encapsulation layer 400. The filler 610 may buffer an external pressure, etc. The filler 610 may include an organic material such as methyl silicone, phenyl silicone, polyimide, and the like. However, the present disclosure is not limited thereto, and the filler 610 may include a urethane-based resin, an epoxy-based resin, and an acryl-based resin that are organic sealants, or may include silicone, etc. that is an inorganic sealant.

The first and second color conversion layers QD1 and QD2, the transmission layer TW, and a partition wall 210 may be arranged on an upper substrate 200 facing the substrate 100. The partition wall 210 may further include scattering particles (not shown).

Each of the first and second color conversion layers QD1 and QD2 may include quantum dots. As described herein, quantum dots denotes a crystal of a semiconductor compound, and may include any material capable of emitting light of various emission wavelengths according to the crystal size Quantum dots exhibit intrinsic excitation and emission characteristics according to materials and sizes, and thus, incident light may be converted into light of a color. Various materials may be employed for quantum dots. For example, the quantum dots may include Group II-VI compounds, Group III-V compounds, Group III-VI compounds, Group semiconductor compounds, Group IV-VI semiconductor compounds, Group IV elements or compounds, or any combinations thereof.

The Group II-VI compounds may be selected from the group consisting of: a binary compound selected from the group consisting of CdS, CdSe, CdTe, ZnS, ZnSe, ZnTe, ZnO, HgS, HgSe, HgTe, MgSe, MgS, and any blends thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any blends thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and any blends thereof.

The Group III-V compounds may be selected from the group consisting of: a binary compound selected from the group consisting of GaN, GaP, GaAs, GaSb, AlN, AlP, AlAs, AlSb, InN, InP, InAs, InSb, and any blends thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and any blends thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any blends thereof. Meanwhile, the Group III-V semiconductor compounds may further include a Group II element. For example, the Group III-V semiconductor compounds further including a Group II element may include InZnP, InGaZnP, InAlZnP, etc.

For example, the Group III-VI semiconductor compounds may include: a binary compound such as GaS, GaSe, $Ga_2Se_3$, GaTe, InS, InSe, $In_2S_3$, $In_2Se_3$, InTe, and the like; and a ternary compound such as $InGaS_3$, $InGaSe_3$, and the like; or any combinations thereof.

For example, the Group semiconductor compounds may include: ternary compounds such as AgInS, $AgInS_2$, CuInS, $CuInS_2$, $CuGaO_2$, $AgGaO_2$, $AgAlO_2$, or the like; or any combinations thereof.

The Group IV-VI compounds may be selected from the group consisting of: a binary compound selected from the group consisting of SnS, SnSe, SnTe, PbS, PbSe, PbTe, and any blends thereof; a ternary compound selected from the group consisting of SnSeS, SnSeTe, SnSTe, PbSeS, PbSeTe, PbSTe, SnPbS, SnPbSe, SnPbTe, and any blends thereof; and a quaternary compound selected from the group consisting of SnPbSSe, SnPbSeTe, SnPbSTe, and any blends thereof.

The Group IV elements may be selected from the group consisting of Si, Ge, and any blends thereof. The Group IV elements may include a binary compound selected from the group consisting of SiC, SiGe, and any blends thereof.

At this time, the binary compounds, the ternary compounds, or the quaternary compounds may be present in particles at a uniform concentration, or may be present in a same particle in partially different concentration distributions.

Quantum dots may be formed in a core-shell structure having a core and a shell. An interface between the core and the shell may have a concentration gradient in which a concentration of elements in the shell decreases toward the center of the core.

The shell of the quantum dot may serve as a protective layer for maintaining semiconductor properties by preventing chemical denaturation of the core and/or a charging layer that imparts electrophoretic properties to the quantum dots. The shell may include a single layer or a multi-layer.

For example, the shell of the quantum dot may include a metal oxide, a metalloid oxide, a non-metal oxide, a semiconductor compound, or any combinations thereof. For example, the metal oxide, the metalloid oxide, or the non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like; a ternary compound such as $MgAl_2O_4$, $CoFe_2O_4$, $NiFe_2O_4$, and $CoMn_2O_4$; or any combinations thereof. For example, the semiconductor compounds may include Group III-VI semiconductor compounds, Group II-VI semiconductor compounds, Group III-V semiconductor compounds, Group III-VI semiconductor compounds, Group semiconductor compounds, Group IV-VI semiconductor compounds as described herein, or any combinations thereof. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combinations thereof.

The quantum dot may have a size of about 45 nm or less, for example, about 40 nm or less, and for example, about 30 nm or less, and the color purity or color reproducibility may be improved in those ranges. In addition, because light emitted from the quantum dots is emitted in all directions, an optical viewing angle may be improved.

In addition, shapes of the quantum dot are not particularly limited to shapes commonly used in the art, but more specifically, spherical, pyramidal, multi-arm, or cubic nanoparticles, nanotubes, nanowires, nanofibers, nanoplatelets, and the like may be used.

The core of the quantum dot may have a diameter of about 2 to about 10 nm, and when the quantum dot is exposed to light, light of a frequency may be emitted depending on a particle size and a material type, and thus, an average size of quantum dots included in the first color conversion layer QD1 and an average size of quantum dots included in the second color conversion layer QD2 may be different from each other. For example, light of a color of a longer wavelength may be emitted as a size of the quantum dot increases. Thus, a size of the quantum dot may be selected according to a color of the first sub-pixel P1 and the second sub-pixel P2.

In addition to the quantum dots, the first and second color conversion layers QD1 and QD2 may further include various materials for mixing and dispersing the quantum dots properly. For example, scattering particles, a solvent, a photoinitiator, a binder polymer, a dispersant, etc., may be further included.

No color conversion layer may be arranged in the emission area EA of the third sub-pixel P3, and the transmission layer TW may be arranged in the emission area EA of the third sub-pixel P3. The transmission layer TW may include an organic material capable of emitting light without converting a wavelength of light emitted from the third organic light-emitting diode OLED3. The transmission layer TW may include scattering particles for uniform color spreading. In this case, the scattering particles may have a diameter in a range of about 200 nm to about 400 nm.

In an embodiment, the transmission layer TW may have a thickness of about 1 μm to about 12 μm. When the thickness of the transmission layer TW is less than about 1 μm, the thickness of the transmission layer TW is so thin that the color spreadability is deteriorated, and therefore, the color purity or the color reproducibility may be deteriorated. On the other hand, when the thickness of the transmission layer TW exceeds about 12 μm, the thickness of the transmission layer TW is so thick that the light emission efficiency may be deteriorated. Therefore, when the thickness of the transmission layer TW is about 1 μm to about 12 μm, the color spreadability may be improved, and the color purity or the color reproducibility may also be improved.

In an embodiment, the first color conversion layer QD1 may have a thickness of about 2 μm to about 18 μm. When the thickness of the first color conversion layer QD1 is less than 2 μm, unconverted light may exist. On the other hand, when the thickness of the first color conversion layer QD1 exceeds about 18 μm, the light conversion efficiency may be deteriorated. Therefore, when the thickness of the first color conversion layer QD1 is about 2 μm to about 18 μm, the light conversion efficiency may be improved, and the color purity or color reproducibility of the sub-pixels may also be improved.

In an embodiment, the second color conversion layer QD2 may have a thickness of about 2 μm to about 18 μm. When the thickness of the second color conversion layer QD2 is less than about 2 μm, light that has not been converted may exist. On the other hand, when the thickness of the second color conversion layer QD2 exceeds about 18 μm, the light conversion efficiency may be deteriorated. Accordingly, when the thickness of the second color conversion layer QD2 is about 2 μm to about 18 μm, the light conversion efficiency may be improved, and the color purity or color reproducibility of the sub-pixels may be improved.

In an embodiment, the first color conversion layer QD1 may include first quantum dots. A content of the first quantum dots in the first color conversion layer QD1 may be about 10% to about 60%. When the content of the first quantum dots in the first color conversion layer QD1 is less than about 10%, light that has not been converted by the first color conversion layer QD1 may be present, and thus, the color purity or color reproducibility of the sub-pixels may be deteriorated. On the other hand, when the content of the first quantum dots in the first color conversion layer QD1 exceeds about 60%, the quantum dots are close to each other, and thus, may collide with each other. Therefore, when about 10% to about 60% of the first quantum dots are included in the first color conversion layer QD1, the color purity or color reproducibility of the sub-pixels may be improved.

In an embodiment, the first color conversion layer QD1 may include scattering particles. A content of the scattering particles in the first color conversion layer QD1 may be about 2% to about 10%. When the content of the scattering particles in the first color conversion layer QD1 is less than about 2%, light emitted from the organic light-emitting diode may not be scattered. On the other hand, when the content of the scattering particles in the first color conversion layer QD1 exceeds about 10%, the scattered light may be directed to a place other than the color filter, thus deteriorating the light conversion efficiency and/or the light emission efficiency.

In an embodiment, the second color conversion layer QD2 may include second quantum dots. A content of the second quantum dots in the second color conversion layer QD2 may be about 10% to about 60%. When the content of the second quantum dots in the second color conversion layer QD2 is less than about 10%, light that has not been converted by the second color conversion layer QD2 may be present, and thus, the color purity or color reproducibility of the sub-pixels may be deteriorated. On the other hand, when the content of the second quantum dots in the second color conversion layer QD2 exceeds about 60%, the quantum dots are close to each other and may collide with each other. Therefore, when the second quantum dots are included in about 10% to 60% in the second color conversion layer QD2, the color purity or color reproducibility of the sub-pixels may be improved.

In an embodiment, the second color conversion layer QD2 may include scattering particles. A content of the scattering particles in the second color conversion layer QD2 may be about 2% to about 10%. When the content of the scattering particles in the second color conversion layer QD2 is less than about 2%, light emitted from the organic light-emitting diode may not be scattered. On the other hand, when the content of the scattering particles in the second color conversion layer QD2 exceeds about 10%, the scattered light may be directed to a place other than the color filter, and thus, the light conversion efficiency and/or the light emission efficiency may be lowered.

In an embodiment, at least one of the first color conversion layer QD1 and the second color conversion layer QD2 may not include quantum dots, but may include scattering particles. For example, when the first sub-pixel P1 emits red light, the second sub-pixel P2 emits green light, and the third sub-pixel P3 emits blue light, the transmission layer TW is applied instead of the second color conversion layer QD2, and thus, a color of the second sub-pixel P2 may be implemented as a color of light emitted by the second organic light-emitting diode OLED2.

The partition wall 210 may be arranged between the first color conversion layer QD1, the second color conversion layer QD2, and the transmission layer TW to correspond to the non-emission area NEA. For example, the partition wall 210 may be arranged between the first color conversion layer QD1 and the second color conversion layer QD2 and between the second color conversion layer QD2 and the transmission layer TW, etc.

The partition wall 210 may include an organic material and a material for controlling an optical density such as Cr or $CrO_X$, $Cr/CrO_X$, $Cr/CrO_X/CrN_Y$, a resin (carbon pigment, RGB mixed pigment, etc.), a graphite, and a non-Cr-based material. In some embodiments, the partition wall 210 may include a pigment of colors such as red, green, and yellow. The partition wall 210 may serve as a black matrix to prevent color mixing and improve visibility.

A first color filter CF1, a second color filter CF2, a third color filter CF3, and a light-blocking pattern BM may be provided between the upper substrate 200 and each of the first and second color conversion layers QD1 and QD2 and the transmission layer TW.

The first, second, and third color filters CF1, CF2, and CF3 may be introduced to implement full color images and improve color purity and outdoor visibility. The first color filter CF1 may pass light converted in the first color conversion layer QD1 and absorb light that is not converted. Likewise, the second color filter CF2 may pass light converted in the second color conversion layer QD2 and absorb light that is not converted. In an embodiment, the second color filter CF2 may be implemented with a same color as light emitted from the second organic light-emitting diode OLED2. The third color filter CF3 may be implemented with a same color as light emitted from the third organic light-emitting diode OLED3. In addition, the first, second, and third color filters CF1, CF2, and CF3 may block light incident from the outside and suppress the emission of quantum dots of the first and second color conversion layers QD1 and QD2.

In an embodiment, the third color filter CF3 may have a thickness of about 0.5 μm to about 5 μm. When the thickness of the third color filter CF3 is less than about 0.5 μm, light incident from the outside may not be blocked. On the other hand, when the thickness of the third color filter CF3 exceeds about 5 μm, light is absorbed by the third color filter CF3, and the light emission efficiency may be deteriorated.

In an embodiment, the first color filter CF1 may be provided in red, the second color filter CF2 may be provided in green, and the third color filter CF3 may be provided in blue.

A light-blocking pattern BM may be arranged between the first to third color filters CF1, CF2, and CF3 so as to correspond to the non-emission area NEA. The light blocking pattern BM is a black matrix and may improve the color clarity and the contrast. The light-blocking pattern BM may include at least one of black pigment, black dye, and black particles. In some embodiments, the light-blocking pattern BM may include a material such as Cr, $CrO_X$, $Cr/CrO_X$, $Cr/CrO_X/CrN_Y$, a resin (e.g., carbon pigment or RGB mixed pigment), a graphite, non-Cr-based material, and the like.

Color filters adjacent to each other among the first, second, and third color filters CF1, CF2, and CF3 may overlap each other in the non-emission area NEA. Because color filters of different colors overlap each other, the light-blocking rate may increase. In some cases, the first, second, and third color filters CF1, CF2, and CF3 and the light-blocking pattern BM may be omitted.

Figure 5:
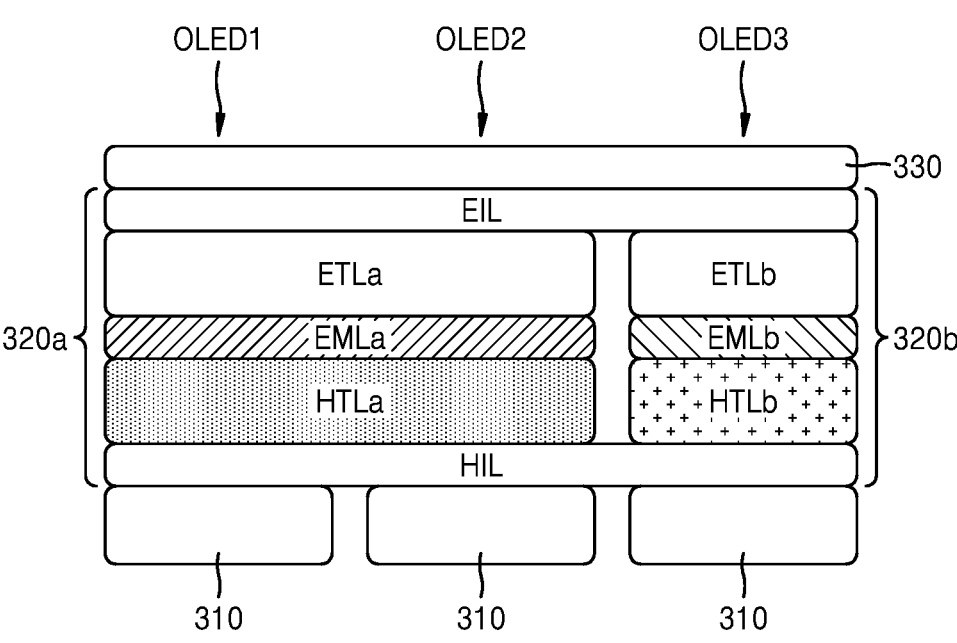
FIG. 5 is a cross-sectional view schematically illustrating part of a display apparatus according to an embodiment.

FIG. 5 is a cross-sectional view schematically illustrating part of a display apparatus according to an embodiment.

Referring to FIG. 5, sub-pixel electrodes 310 of a first organic light-emitting diode OLED1, a second organic light-emitting diode OLED2, and a third organic light-emitting diode OLED3 may be patterned to respectively correspond to the first organic light-emitting diode OLED1, the second organic light-emitting diode OLED2, and the third organic light-emitting diode OLED3.

The first organic light-emitting diode OLED1 and the second organic light-emitting diode OLED2 may include a first intermediate layer 320a, and the first intermediate layer 320a may include a first emission layer EMLa. In addition, the first intermediate layer 320a may further include a hole injection layer HIL, a first hole transport layer HTLa, a first electron transport layer ETLa, and an electron injection layer EIL. The hole injection layer HIL may be arranged between the sub-pixel electrodes 310 and the first hole transport layer HTLa. The first hole transport layer HTLa may be arranged between the hole injection layer HIL and the first emission layer EMLa. The first electron transport layer ETLa may be arranged on the first emission layer EMLa so as to transport electrons coming from the opposite electrode 330 to the first emission layer EMLa. The electron injection layer EIL may be arranged between the first electron transport layer ETLa and the opposite electrode 330.

The third organic light-emitting diode OLED3 may include a second intermediate layer 320b, and the second intermediate layer 320b may include a second emission layer EMLb. In addition, the second intermediate layer 320b may further include the hole injection layer HIL, a second hole transport layer HTLb, a second electron transport layer ETLb, and the electron injection layer EIL. The hole injection layer HIL may be arranged between the sub-pixel electrode 310 and the second hole transport layer HTLb. The second hole transport layer HTLb may be arranged between the hole injection layer HIL and the second emission layer EMLb. The second electron transport layer ETLb may be arranged above the second emission layer EMLb so as to transport electrons coming from an opposite electrode 330 to the second emission layer EMLb. The electron injection layer EIL may be arranged between the second electron transport layer ETLb and the opposite electrode 330.

The hole injection layer HIL may be commonly applied to the first to third organic light-emitting diodes OLED1, OLED2, and OLED3. The hole injection layer HIL may enable a smooth hole injection, and may include one or more materials selected from the group consisting of HATCN, copper phthalocyanine (CuPc), poly(3,4)-ethylenedioxythiophene (PEDOT), polyaniline (PANT), and N, N-dinaphthyl-N, N'-diphenylbenzidine (NPD), but is not limited thereto.

In an embodiment, the first organic light-emitting diode OLED1 and the second organic light-emitting diode OLED2 may commonly include the first emission layer EMLa and the first hole transport layer HTLa, and the second emission layer EMLb and the second hole transport layer HTLb may be provided in the third organic light-emitting diode OLED3.

The first emission layer EMLa and the second emission layer EMLb may emit light of different colors from each other. In an embodiment, the first emission layer EMLa may include an organic material emitting green light, and the second emission layer EMLb may include an organic material emitting blue light.

The first emission layer EMLa may be formed by using, for example, a green dopant in a host material. The second emission layer EMLb may be formed by using, for example, a blue dopant in a host material.

The first hole transport layer HTLa may be arranged between the sub-pixel electrodes 310 of the first organic light-emitting diode OLED1 and the second organic light-emitting diode OLED2 and the first emission layer EMLa, and the second hole transport layer HTLb may be arranged between the sub-pixel electrode 310 of the third organic light-emitting diode OLED3 and the second emission layer EMLb.

In an embodiment, a hole mobility of the first hole transport layer HTLa may be equal to a hole mobility of the second hole transport layer HTLb. In an embodiment, the hole mobility of the first hole transport layer HTLa may be different from the hole mobility of the second hole transport layer HTLb. For example, the hole mobility of the first hole transport layer HTLa may be less than that of the second hole transport layer HTLb.

In an embodiment, each of the first hole transport layer HTLa, and the second hole transport layer HTLb may include, as a host thereof, a triphenylamine derivative having high hole mobility and excellent stability, such as N, N'-diphenyl-N,N'-bis(3-methylphenyl)-1, 1'-bi-phenyl-4,4'-diamine (TPD), N,N'-di(naphthalen-1-yl)-N,N'-diphenyl-benzidine (NPB), and the like.

To control the hole mobilities of the first hole transport layer HTLa and the second hole transport layer HTLb, the host of the first hole transport layer HTLa may be doped with a P-type organic dopant so as to increase the hole mobility thereof. The P-type organic dopant may include a quinone derivative such as tetracyanoquinonedimethane (TCNQ) and 2,3,5,6-tetrafluoro-tetracyano-1,4-benzoquinonedimethane (F4-TCNQ), and a cyano-group-containing compound such as 2-(7-dicyanomethylene-1,3,4,5,6,8,9,10-octafluoro-7H-pyrene-2-ylidene)-malononitrile (NDP-9; a commercial product by Novaled Corporation). A doping concentration of the P-type organic dopant may be about 0.5% to about 25%.

The host of the second hole transport layer HTLb may be doped with an oxide having a high dielectric constant to reduce the hole mobility of the second hole transport layer HTLb. The dielectric constant of the oxide may have a value in a range of about 3 to about 60. The oxide may include one from among $HfO_X$, $ZrO_X$, $LaO_X$, $La_2O_3$, $LaAlO_X$, $TaO_X$, $AlO_X$, $Al_2O_3$, $SiO_2$, $ZrSiO_4$, $HfSiO_4$, $SrO$, $Y_2O_3$, $CaO$, $BaO$, $BaZrO$, $MgO$, and $TiO_2$. In this case, the doping concentration of the oxide may be about 0.5% to about 30%.

In an embodiment, the hole mobility may be controlled by doping the host with an oxide having a high dielectric constant with respect to both of the first hole transport layer HTLa and the second hole transport layer HTLb. For example, by lowering a doping concentration of the oxide doped on the first hole transport layer HTLa compared to a doping concentration of the oxide doped on the second hole transport layer HTLb, the hole mobility of the first hole transport layer HTLa may be controlled higher than the hole mobility of the second hole transport layer HTLb.

The first electron transport layer ETLa and the second electron transport layer ETLb may make the transport of electrons smooth, and may include one or more materials selected from the group consisting of tris(8-hydroxyquinolino)aluminum) (Alq3), PBD, TAZ, spiro-PBD, BAlq, lithium quinolate (Liq), BMB-3T, PF-6P, TPBI, COT, and SAlq, but are not limited thereto. In an embodiment, the first electron transport layer ETLa may include a different material from a material of the second electron transport layer ETLb. In an embodiment, the first electron transport layer ETLa and the second electron transport layer ETLb may include a same material.

The electron injection layer EIL may be commonly applied to the first to third organic light-emitting diodes OLED1, OLED2, and OLED3. For example, the electron injection layer EIL may be Yb, tris(8-hydroxyquinolino) aluminum (Alq3), PBD, TAZ, Spiro-PBD, BAlq or SAlq, but is not limited thereto.

Figure 6:
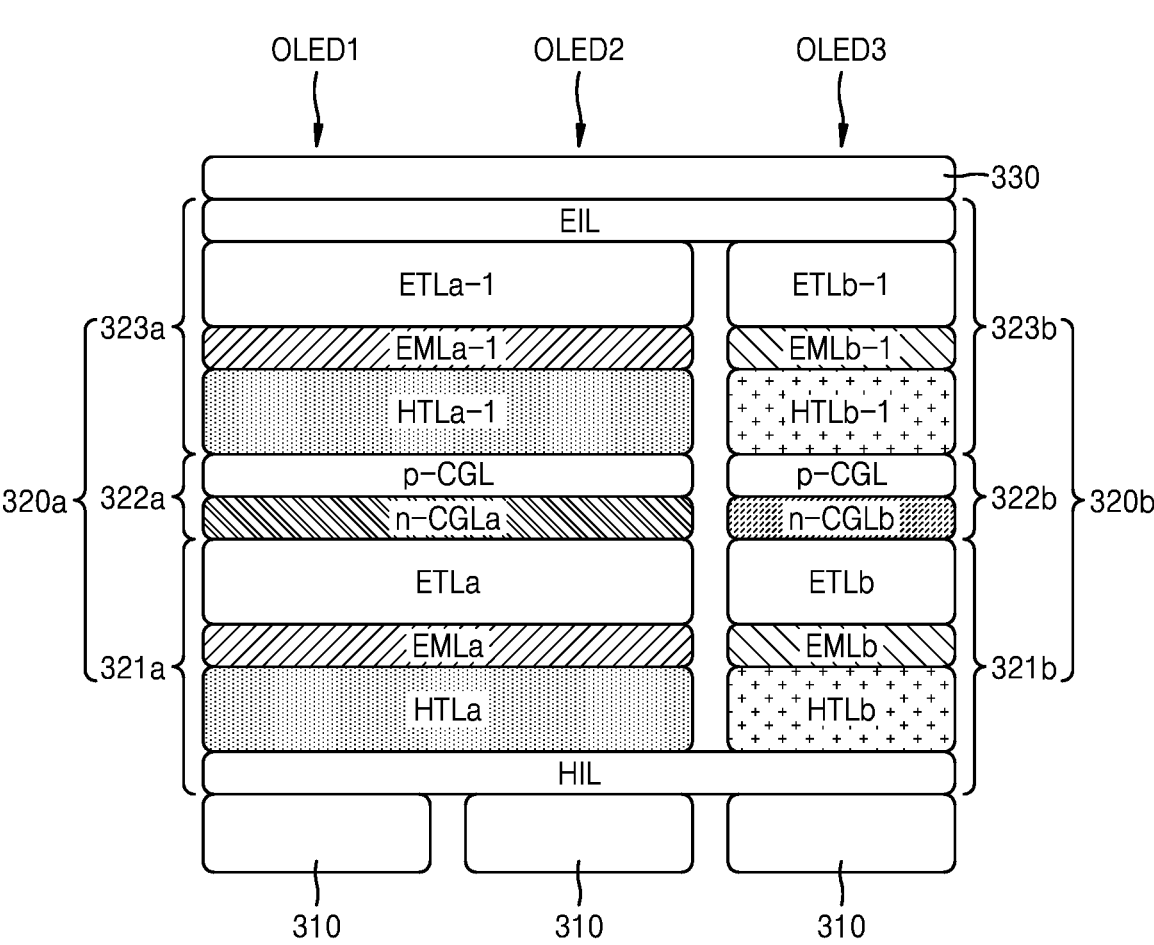
FIG. 6 is a cross-sectional view schematically illustrating part of a display apparatus according to an embodiment.

FIG. 6 is a cross-sectional view schematically illustrating part of a display apparatus according to an embodiment. In FIG. 6, the same reference symbols as those of FIG. 5 denote the same, and redundant descriptions thereof will be omitted for ease in explanation of the embodiment.

Referring to FIG. 6, the first and second intermediate layers 320a and 320b of the first to third organic light-emitting diodes OLED1, OLED2, and OLED3 may be provided by stacking a plurality of emission layers. For example, the first intermediate layer 320a of the first organic light-emitting diode OLED1 and the second organic light-emitting diode OLED2 may include the first emission layer EMLa and a $(1-1)^{st}$ (or, first intermediate) emission layer EMLa-1. In an embodiment, the (1-1)st emission layer EMLa-1 and the first emission layer EMLa may include a same material. For example, each of the first emission layer EMLa and the $(1\text{-}1)^{st}$ emission layer EMLa-1 may include an organic material that emits green light.

The second intermediate layer 320*b* of the third organic light-emitting diode OLED3 may include the second emission layer EMLb and a $(2\text{-}1)^{st}$ (or, second intermediate) emission layer EMLb-1. In an embodiment, the $(2\text{-}1)^{st}$ emission layer EMLb-1 and the second emission layer EMLb may include a same material. For example, each of the second emission layer EMLb and the $(2\text{-}1)^{st}$ emission layer EMLb-1 may include an organic material emitting blue light.

In an embodiment, the first intermediate layer 320*a* may include a first stack 321*a* including the first emission layer EMLa, a $(1\text{-}1)^{st}$ stack 323*a* including the $(1\text{-}1)^{st}$ emission layer EMLa-1, and a first charge generation layer 322*a* therebetween.

The first stack 321*a* may be provided in a structure in which the hole injection layer HIL, the first hole transport layer HTLa, the first emission layer EMLa, and the first electron transport layer ETLa are sequentially stacked. The $(1\text{-}1)^{st}$ stack 323*a* may have a structure in which a (1-1)st hole transport layer HTLa-1, the $(1\text{-}1)^{st}$ emission layer EMLa-1, and a $(1\text{-}1)^{st}$ electron transport layer ETLa-1 are sequentially stacked.

The first charge generation layer 322*a* may supply electric charges to the first stack 321*a* and the $(1\text{-}1)^{st}$ stack 323*a*. The first charge generation layer 322*a* may include an n-type charge generation layer and a p-type charge generation layer. In this case, the n-type charge generation layer and the p-type charge generation layer may be in direct contact with each other and form a PN junction. By the PN junction, electrons and holes may be simultaneously generated between the n-type charge generation layer and the p-type charge generation layer. The n-type denotes an n-type semiconductor property, that is, a property of injecting or transporting electrons. The p-type denotes a p-type semiconductor property, that is, a property of injecting or transporting holes.

The first charge generation layer 322*a* may include a first n-type charge generation layer n-CGLa and a p-type charge generation layer p-CGL, wherein the first n-type charge generation layer is for supplying electrons to the first stack 321*a*, and the p-type charge generation layer p-CGL is for supplying holes to the $(1\text{-}1)^{st}$ stack 323*a*. The first n-type charge generation layer n-CGLa may include a metal material as a dopant.

Similarly, the second intermediate layer 320*b* may include a second stack 321*b* including the second emission layer EMLb, a $(2\text{-}1)^{st}$ stack 323*b* including the $(2\text{-}1)^{st}$ emission layer EMLb-1, and a second charge generation layer 322*b* therebetween.

The second stack 321*b* may have a structure in which the hole injection layer HIL, the second hole transport layer HTLb, the second emission layer EMLb, and the second electron transport layer ETLb are sequentially stacked. The $(2\text{-}1)^{st}$ stack 323*b* may have a structure in which a $(2\text{-}1)^{st}$ hole transport layer HTLb-1, the $(2\text{-}1)^{st}$ emission layer EMLb-1, and a $(2\text{-}1)^{st}$ electron transport layer ETLb-1 are sequentially stacked.

The second charge generation layer 322*b* may supply charges to the second stack 321*b* and the $(2\text{-}1)^{st}$ stack 323*b*. The second charge generation layer 322*b* may include a second n-type charge generation layer n-CGLb and a p-type charge generation layer p-CGL, wherein the second n-type charge generation layer is for supplying electrons to the second stack 321*b*, and the p-type charge generation layer p-CGL is for supplying holes to the $(2\text{-}1)^{st}$ stack 323*b*. The second n-type charge generation layer n-CGLb may include a metal material as a dopant.

Some elements of the first intermediate layer 320*a* and the second intermediate layer 320*b* may include a same material. For example, the hole injection layer HIL and the electron injection layer EIL may be commonly applied to the first intermediate layer 320*a* and the second intermediate layer 320*b*.

For example, when a blue emission layer is applied to all of the first organic light-emitting diode OLED1, the second organic light-emitting diode OLED2, and the third organic light-emitting diode OLED3, light conversion may be performed on the first sub-pixel P1 and the second sub-pixel P emitting red light or green light so as to produce a same luminance as the third sub-pixel P3 emitting blue light, thus increasing a driving voltage applied to the first organic light-emitting diode OLED1 and the second organic light-emitting diode OLED2. Therefore, the power consumption may rapidly increase while the lifespan of the first and second organic light-emitting diode OLED1 and OLED2 may be reduced.

To this end, a green emission layer may be applied to the first organic light-emitting diode OLED1 and the second organic light-emitting diode OLED2, and a blue emission layer may be applied to the third organic light-emitting diode OLED3. However, when the blue emission layer is applied only to the third organic light-emitting diode OLED3, the efficiency and lifespan of the third organic light-emitting diode OLED3 to which the blue emission layer is applied may be lower than the efficiency and lifespan of the first organic light-emitting diode OLED1 and the second organic light-emitting diode OLED2 to which the green emission layer is applied.

In an embodiment, the charge generation characteristic of the second n-type charge generation layer n-CGLb arranged in the third sub-pixel P3 area may be improved compared to the charge generation characteristic of the first n-type charge generation layer n-CGLa arranged in the first sub-pixel P1 area and the second sub-pixel P2 area. For example, the charge generation characteristic of the second n-type charge generation layer n-CGLb arranged in the third sub-pixel P3 may be improved compared to the charge generation characteristic of the first n-type charge generation layer n-CGLa arranged in the first sub-pixel P1 area and the second sub-pixel P2 area by controlling a material forming the first n-type charge generation layer n-CGLa and the second n-type charge generation layer n-CGLb and/or a content of the material.

In an embodiment, the first n-type charge generation layer n-CGLa and the second n-type charge generation layer n-CGLb may be provided by doping a host with a dopant. For example, the host of the first n-type charge generation layer n-CGLa and the second n-type charge generation layer n-CGLb may include a phosphine-oxide-based material, a phenanthroline-based material, etc., but is not limited thereto. A metal in the first n-type charge generation layer n-CGLa and the second n-type charge generation layer n-CGLb may be an alkali metal, an alkaline earth metal, a rare earth metal, a transition metal and a post-transition metal, or any combinations thereof. The metal may include lithium (Li), potassium (K), rubidium (Rb), cesium (Cs), barium (Ba), europium (Eu), sodium (Na), strontium (Sr), samarium (Sm), calcium (Ca), terbium (Tb), cerium (Ce), magnesium (Mg), scandium (Sc), yttrium (Y), ytterbium (Yb), gadolinium (Gd), or any combinations thereof.

In an embodiment, the first n-type charge generation layer n-CGLa may include a first material, and the second n-type charge generation layer n-CGLb may include a second material different from the first material.

In an embodiment, the first n-type charge generation layer n-CGLa may be provided by doping the host with a concentration of about 0.5% to about 20% of the first material. When a doping concentration of the first material in the first n-type charge generation layer n-CGLa is less than about 0.5%, an electrical conductivity of the first n-type charge generation layer n-CGLa is so low that the efficiency of the organic light-emitting diode may decrease. On the other hand, when a doping concentration of the first material in the first n-type charge generation layer n-CGLa exceeds about 20%, an electrical conductivity may rapidly increase, the first n-type charge generation layer n-CGLa may have the properties of a metal layer, and the first n-type charge generation layer n-CGLa may become opaque. Therefore, when the doping concentration of the first material in the first n-type charge generation layer n-CGLa is about 0.5% to about 20%, the efficiency of the organic light-emitting diode may be improved, and the first n-type charge generation layer n-CGLa may be provided in a transparent state. In an embodiment, the doping concentration of the first material in the first n-type charge generation layer n-CGLa may be about 1% to about 10%. In an embodiment, the doping concentration of the first material in the first n-type charge generation layer n-CGLa may be about 5%.

In an embodiment, the second n-type charge generation layer n-CGLb may be provided by doping the host with a concentration about 0.5% to about 20% of the second material. When a doping concentration of the second material in the second n-type charge generation layer n-CGLb is less than about 0.5%, an electrical conductivity of the second n-type charge generation layer n-CGLb is so low that the efficiency of the organic light-emitting diode may be deteriorated. On the other hand, when the doping concentration of the second material in the second n-type charge generation layer n-CGLb exceeds about 20%, an electrical conductivity may rapidly increase, the second n-type charge generation layer n-CGLb may have the properties of a metal layer, and the second n-type charge generation layer n-CGLb may become opaque. Therefore, when the doping concentration of the second material in the second n-type charge generation layer n-CGLb is about 0.5% to about 20%, the efficiency of the organic light-emitting diode may be improved, and the second n-type charge generation layer n-CGLb may be provided in a transparent state. In an embodiment, the doping concentration of the second material in the second n-type charge generation layer n-CGLb may be about 1% to about 10%. In an embodiment, the doping concentration of the second material in the second n-type charge generation layer n-CGLb may be about 5%.

In an embodiment, each of the first material and the second material may include lithium (Li), potassium (K), rubidium (Rb), cesium (Cs), barium (Ba), europium (Eu), sodium (Na), strontium (Sr), samarium (Sm), calcium (Ca), terbium (Tb), cerium (Ce), ytterbium (Yb), or any combinations thereof. At this time, a work function of lithium (Li) may be 2.30 eV, a work function of potassium (K) may be 2.29 eV, a work function of rubidium (Rb) may be 2.26 eV, a work function of cesium (Cs) may be 2.14 eV, a work function of barium (Ba) may be 2.52 eV, a work function of europium (Eu) may be 2.50 eV, a work function of sodium (Na) may be 2.36 eV, a work function of strontium (Sr) may be 2.59 eV, a work function of samarium (Sm) may be 2.69 eV, a work function of calcium (Ca) may be 2.87 eV, a work function of terbium (Tb) may be 3.00 eV, a work function of cerium (Ce) may be 2.90 eV, and a work function of ytterbium (Yb) may be 2.70 eV.

In an embodiment, the second material may have a shallower work function than the first material. In an embodiment, a work function of the first material and the second material may be about 2.0 eV to about 3.0 eV, and the work function of the second material may be less than the work function of the first material. For example, the first material may include at least one of ytterbium (Yb), calcium (Ca), terbium (Tb), and cerium (Ce), and the second material may include lithium (Li), potassium (K), rubidium (Rb), cesium (Cs), barium (Ba), europium (Eu), sodium (Na), strontium (Sr), samarium (Sm), or any combinations thereof having a shallower work function than the above-mentioned ytterbium (Yb), calcium (Ca), terbium (Tb), and cerium (Ce).

TABLE 1

|  | Doping concentration (%) | Driving voltage (V) |
|---|---|---|
| Lithium (Li) | 1% | 10.7 V |
| Lithium (Li) | 2% | 10.7 V |
| Lithium (Li) | 3% | 10.5 V |
| Lithium (Li) | 5% | 10.4 V |
| Lithium (Li) | 10% | 10.4 V |
| Ytterbium (Yb) | 5% | 11.1 V |

Table 1 is a table showing the measurement result of a driving voltage of an organic light-emitting diode including an n-type charge generation layer doped with lithium (Li) or ytterbium (Yb).

Referring to Table 1, it may be seen that, when a doping concentration of lithium (Li) in the n-type charge generation layer n-CGLa increases, the driving voltage drops. In addition, it may be seen that, at a same doping concentration (e.g., 5%), the driving voltage of the organic light-emitting diode including the n-type charge generation layer n-CGLa doped with ytterbium (Yb) is about 0.7 V greater than the driving voltage of the organic light-emitting diode including the n-type charge generation layer n-CGLa doped with lithium (Li). Because the driving voltage of the organic light-emitting diode including the n-type charge generation layer n-CGLa doped with lithium (Li) is less than the driving voltage of the organic light-emitting diode including the n-type charge generation layer n-CGLa doped with ytterbium (Yb), it may be seen that the efficiency of the organic light-emitting diode including the n-type charge generation layer n-CGLa doped with lithium (Li) is greater than the efficiency of the organic light-emitting diode including the n-type charge generation layer n-CGLa doped with ytterbium (Yb).

When the work function of the second material is shallower than the work function of the first material, the injection barrier with the electron transport layer ETL is lowered, and thus, the characteristics of the organic light-emitting diode may be improved.

Therefore, by doping the second n-type charge generation layer n-CGLb with a metal having a shallower work function than the first n-type charge generation layer n-CGLa, the injection barrier of the second n-type charge generation layer n-CGLb and the electron transport layer ETL is lowered, and thus, the characteristics of the organic light-emitting diode including the second n-type charge generation layer n-CGLb may be improved. Through this, the efficiency of the third organic light-emitting diode OLED3 corresponding to the third sub-pixel P3 may be improved, and the lifespan of the third organic light-emitting diode OLED3 may also be improved.

Figure 7:
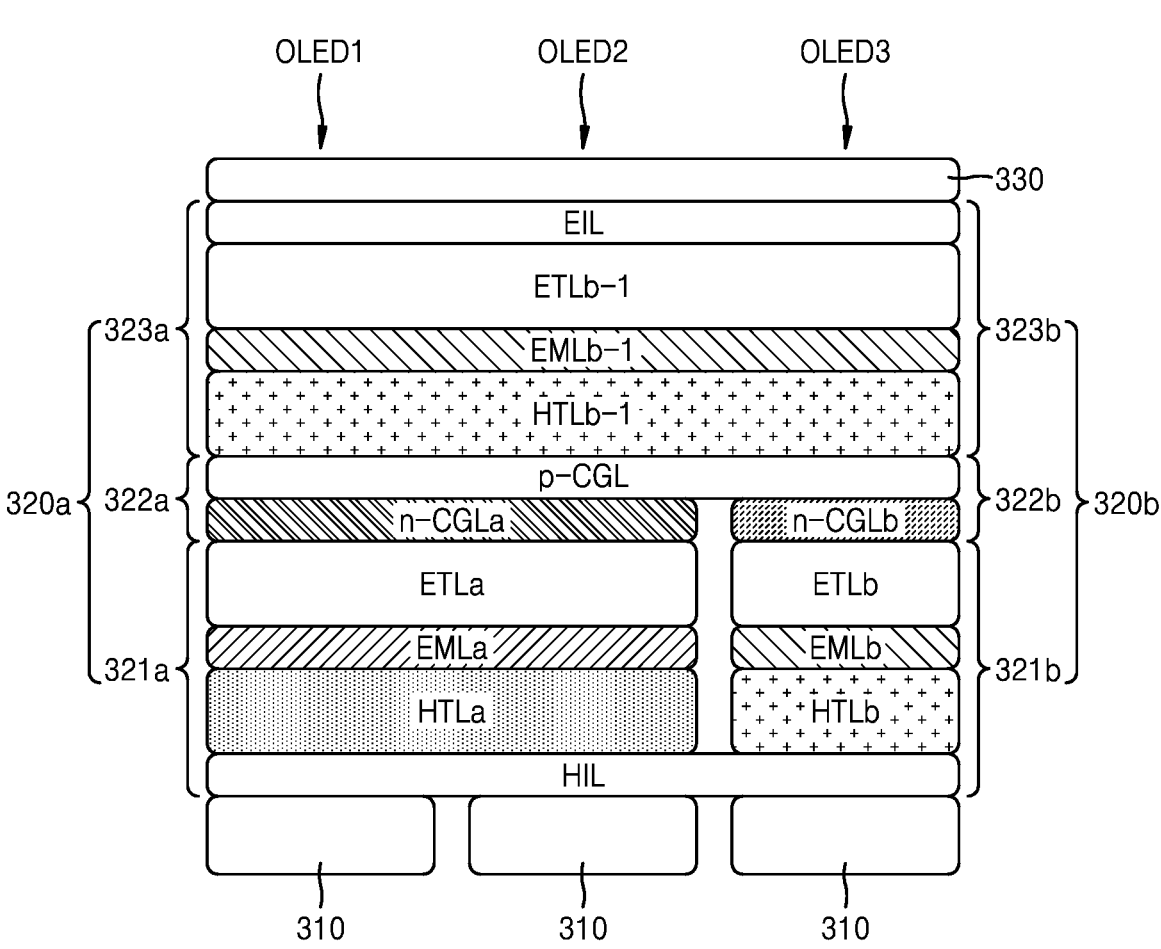
FIG. 7 is a cross-sectional view schematically illustrating part of a display apparatus according to an embodiment.

FIG. 7 is a cross-sectional view schematically illustrating part of a display apparatus according to an embodiment. In FIG. 7, the same reference symbols as those of FIG. 6 denote the same, and redundant descriptions thereof will be omitted for ease in explanation of the embodiment.

Referring to FIG. 7, the first intermediate layer 320a and one of stacks of the second intermediate layer 320b may include a same material. For example, the $(2-1)^{st}$ stack 323b of the second intermediate layer 320b may be commonly applied to the first intermediate layer 320a and the second intermediate layer 320b. Accordingly, the first intermediate layer 320a of the first organic light-emitting diode OLED1 and the second organic light-emitting diode OLED2 may include the first emission layer EMLa and the $(2-1)^{st}$ emission layer EMLb-1, and the second intermediate layer 320b of the third organic light-emitting diode OLED3 may include the second emission layer EMLb and the $(2-1)^{st}$ emission layer EMLb-1. In an embodiment, the first emission layer EMLa may include an organic material emitting green light, and each of the second emission layer EMLb and the $(2-1)^{st}$ emission layer EMLb-1 may include an organic material emitting blue light.

In an embodiment, when the first intermediate layer 320a and one of stacks of the second intermediate layer 320b include a same material, a process may be simplified.

FIG. 7 shows that the $(2-1)^{st}$ stack 323b of the second intermediate layer 320b is commonly applied to the first intermediate layer 320a and the second intermediate layer 320b, but the present disclosure is not limited thereto. Although not shown, the second stack 321b of the second intermediate layer 320b may be commonly applied to the first intermediate layer 320a and the second intermediate layer 320b.

Figure 8:
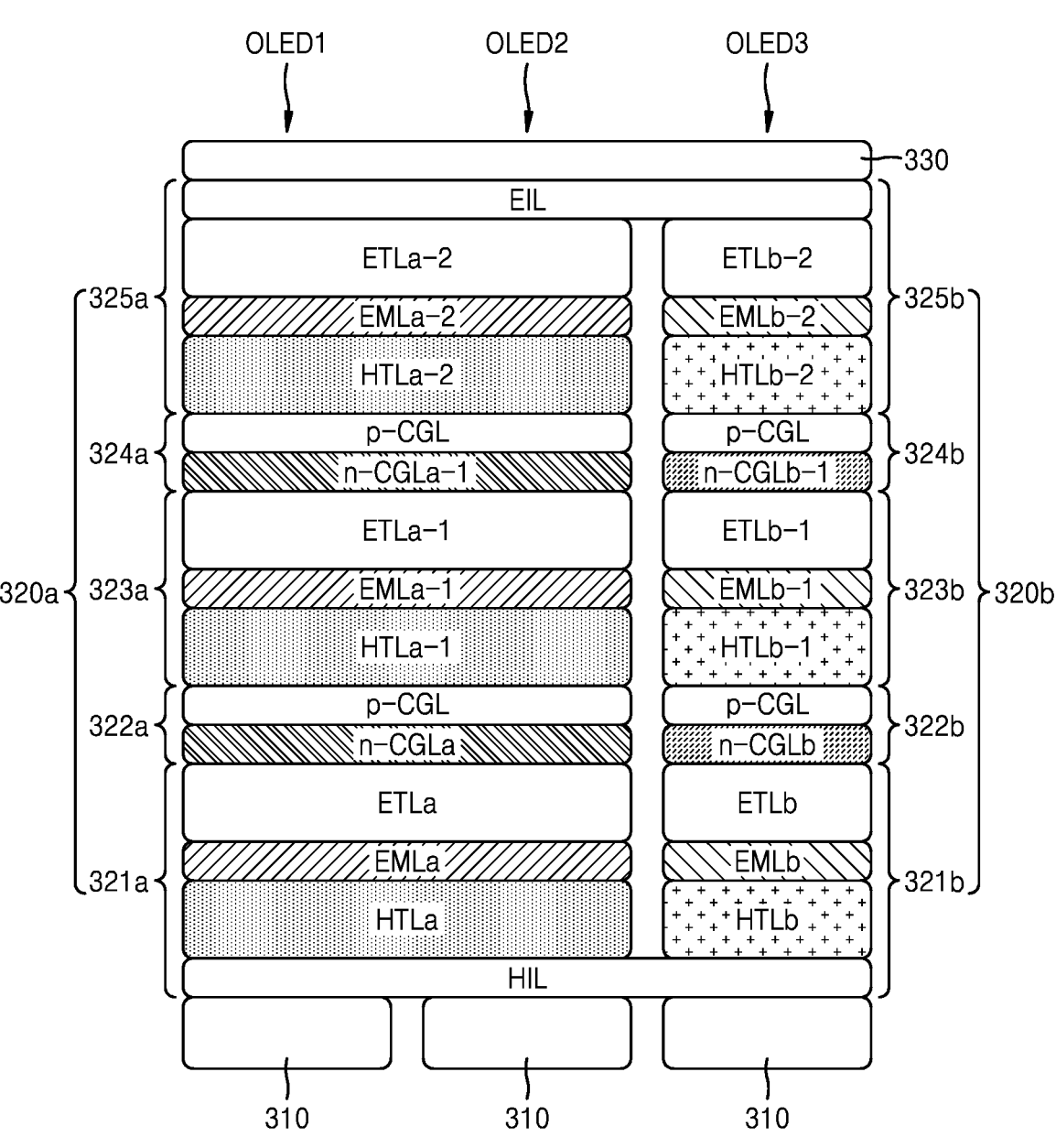
FIGS. 8 and 9 are cross-sectional views schematically illustrating part of a display apparatus according to an embodiment.
Figure 9:
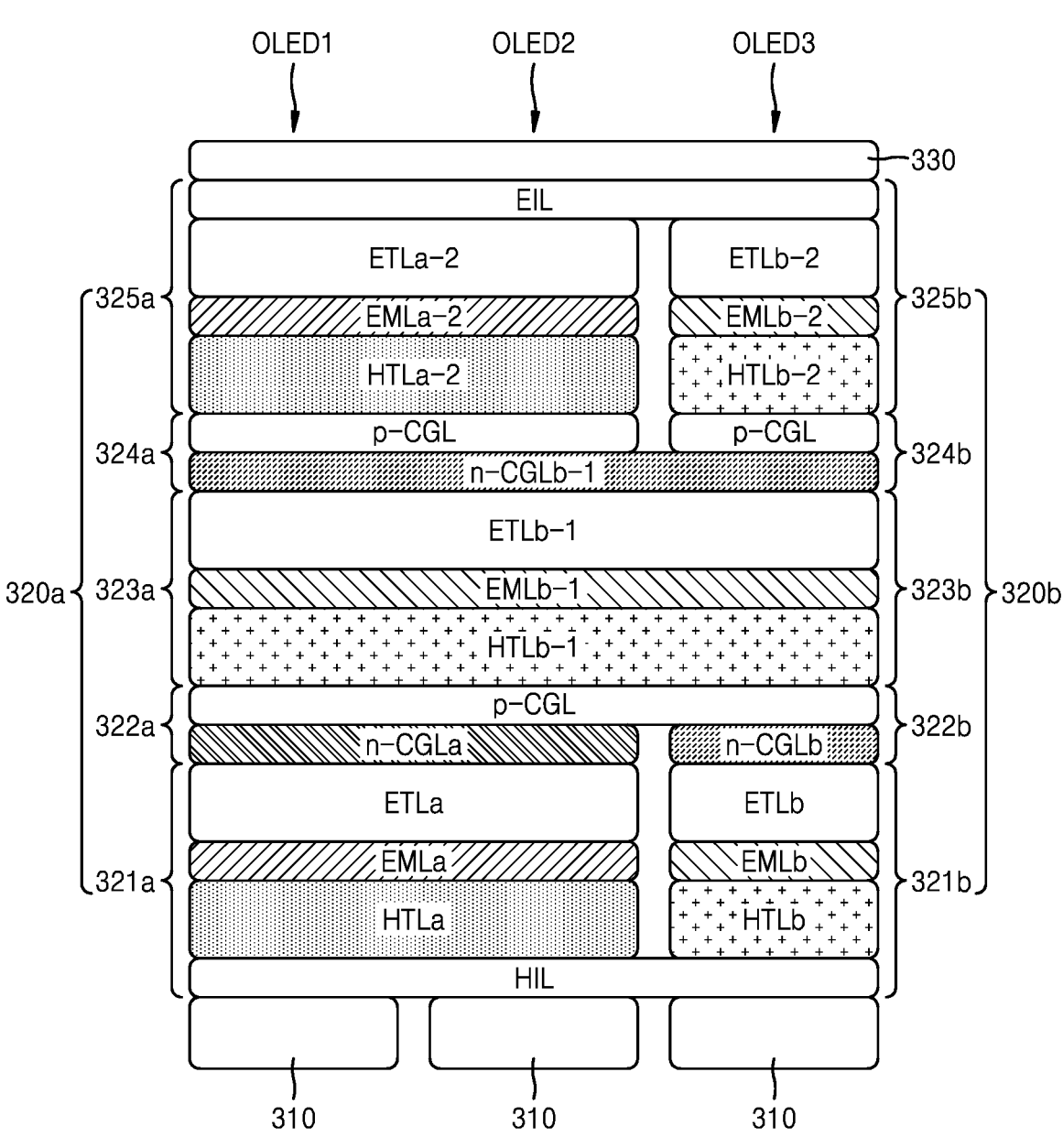

FIGS. 8 and 9 are cross-sectional views schematically illustrating part of a display apparatus according to an embodiment. In FIGS. 8 and 9, the same reference symbols as those of FIGS. 6 and 7 denote the same, and redundant descriptions thereof will be omitted for ease in explanation of the embodiment.

Referring to FIGS. 8 and 9, the first and second intermediate layers 320a and 320b of the first to third organic light-emitting diodes OLED1, OLED2, and OLED3 may be provided by stacking a plurality of emission layers. FIGS. 8 and 9 show a structure in which three emission layers are stacked on one organic light-emitting diode, but the present disclosure is not limited thereto. Although not shown, four or more emission layers may be provided on one organic light-emitting diode.

In an embodiment, for example, the first intermediate layer 320a of the first organic light-emitting diode OLED1 and the second organic light-emitting diode OLED2 may include the first emission layer EMLa, the $(1-1)^{st}$ emission layer EMLa-1, and a $(1-2)^{nd}$ emission layer EMLa-2. In an embodiment, the first emission layer EMLa, the $(1-1)^{st}$ emission layer EMLa-1, and the $(1-2)^{nd}$ emission layer EMLa-2 may include a material emitting a same color as each other. For example, each of the first emission layer EMLa, the (1-1)st emission layer EMLa-1, and the (1-2)nd emission layer EMLa-2 may include an organic material emitting green light.

In an embodiment, at least one of the first emission layer EMLa, the $(1-1)^{st}$ emission layer EMLa-1, and the $(1-2)^{nd}$ emission layer EMLa-2 may include a material emitting light of a different color from the other ones. For example, each of the first emission layer EMLa, the $(1-1)^{st}$ emission layer EMLa-1, and the $(1-2)^{nd}$ emission layer EMLa-2 may include an organic material that sequentially emits green light, green light, and blue light, or may include an organic material that sequentially emits green light, blue light, and green light, or may include an organic material that sequentially emits blue light, green light, and green light.

The second intermediate layer 320b of the third organic light-emitting diode OLED3 may include the second emission layer EMLb, the $(2-1)^{st}$ emission layer EMLb-1, and a $(2-2)^{nd}$ emission layer EMLb-2. In an embodiment, each of the second emission layer EMLb, the $(2-1)^{st}$ emission layer EMLb-1, and the $(2-2)^{nd}$ emission layer EMLb-2 may include a material emitting light of a same color. For example, all of the second emission layer EMLb, the $(2-1)^{st}$ emission layer EMLb-1, and the $(2-2)^{nd}$ emission layer EMLb-2 may include an organic material emitting blue light.

In an embodiment, the first intermediate layer 320a may include the first stack 321a including the first emission layer EMLa, the $(1-1)^{st}$ stack 323a including the $(1-1)^{st}$ emission layer EMLa-1, a $(1-2)^{nd}$ stack 325a including the $(1-2)^{nd}$ emission layer EMLa-2, and first and second charge generation layers 322a and 324a, wherein the first charge generation layer 322a is between the first stack 321a and the $(1-1)^{st}$ stack 323a, and the second charge generation layer 324a is between the $(1-1)^{st}$ stack 323a and the $(1-2)^{nd}$ stack 325a. The $(1-2)^{nd}$ stack 325a may be provided in a structure in which a $(1-2)^{nd}$ hole transport layer HTLa-2, a $(1-2)^{nd}$ emission layer EMLa-2, a $(1-2)^{nd}$ electron transport layer ETLa-2, and the electron injection layer EIL are sequentially stacked.

The first charge generation layer 322a may be located between the first stack 321a and the (1-1)st stack 323a, and a (1-1)st charge generation layer 324a may be located between the (1-1)st stack 323a and the (1-2)nd stack 325a. The first charge generation layer 322a may include the first n-type charge generation layer n-CGLa and the p-type charge generation layer p-CGL, and the $(1-1)^{st}$ charge generation layer 324a may include a $(1-1)^{st}$ n-type charge generation layer n-CGLa-1 and another p-type charge generation layer p-CGL. In an embodiment, the first n-type charge generation layer n-CGLa and the $(1-1)^{st}$ n-type charge generation layer n-CGLa-1 may include a same material.

Similarly, the second intermediate layer 320b may include the second stack 321b including the second emission layer EMLb, the $(2-1)^{st}$ stack 323b including the $(2-1)^{st}$ emission layer EMLb-1, a $(2-2)^{nd}$ stack 325b including the $(2-2)^{nd}$ emission layer EMLb-2, and second and $(2-1)^{st}$ charge generation layers 322b and 324b between each stack. The $(2-2)^{nd}$ stack 325b may be provided in a structure in which a $(2-2)^{nd}$ hole transport layer HTLb-2, a $(2-2)^{nd}$ emission layer EMLb-2, a $(2-2)^{nd}$ electron transport layer ETLb-2, and the electron injection layer EIL are sequentially stacked.

The second charge generation layer 322b may be located between the second stack 321b and the $(2-1)^{st}$ stack 323b, and the $(2-1)^{st}$ charge generation layer 324b may be located between the $(2-1)^{st}$ stack 323b and the $(2-2)^{nd}$ stack 325b. The second charge generation layer 322b may include the second n-type charge generation layer n-CGLb and the p-type charge generation layer p-CGL, and the $(2-1)^{st}$ charge generation layer 324b may include a $(2-1)^{st}$ n-type charge generation layer n-CGLb-1 and another p-type charge generation layer p-CGL. In an embodiment, the second n-type charge generation layer n-CGLb and the $(2-1)^{st}$ n-type charge generation layer n-CGLb-1 may include a same material.

Some elements of the first intermediate layer 320a and the second intermediate layer 320b may include a same material. For example, the hole injection layer HIL and/or the electron injection layer EIL may be commonly applied to the first intermediate layer 320a and the second intermediate layer 320b.

In addition, as shown in FIG. 9, the first intermediate layer 320a and one of stacks of the second intermediate layer 320b may include a same material. For example, the $(2\text{-}1)^{st}$ stack 323b of the second intermediate layer 320b may be commonly applied to the first intermediate layer 320a and the second intermediate layer 320b. Accordingly, the first intermediate layer 320a of the first organic light-emitting diode OLED1 and the second organic light-emitting diode OLED2 may include the first emission layer EMLa, the $(2\text{-}1)^{st}$ emission layer EMLb-1, and the (1-2)nd emission layer EMLa-2 and the second intermediate layer 320b of the third organic light-emitting diode OLED3 may include the second emission layer EMLb, the $(2\text{-}1)^{st}$ emission layer EMLb-1, and the $(2\text{-}2)^{nd}$ emission layer EMLb-2. In an embodiment, each of the first emission layer EMLa and the $(1\text{-}2)^{nd}$ emission layer EMLa-2 may include an organic material emitting green light, and each of the second emission layer EMLb, the $(2\text{-}1)^{st}$ emission layer EMLb-1, and the $(2\text{-}2)^{nd}$ emission layer EMLb-2 may include an organic material emitting blue light.

In an embodiment, when the first intermediate layer 320a and one of stacks of the second intermediate layer 320b include a same material, a process may be simplified.

In FIG. 9, the $(2\text{-}1)^{st}$ stack 323b of the second intermediate layer 320b is commonly applied to the first intermediate layer 320a and the second intermediate layer 320b, but the present disclosure is not limited thereto. Although not shown, the second stack 321b or $(2\text{-}2)^{nd}$ stack 325b of the second intermediate layer 320b may be commonly applied to the first intermediate layer 320a and the second intermediate layer 320b.

Figure 10:
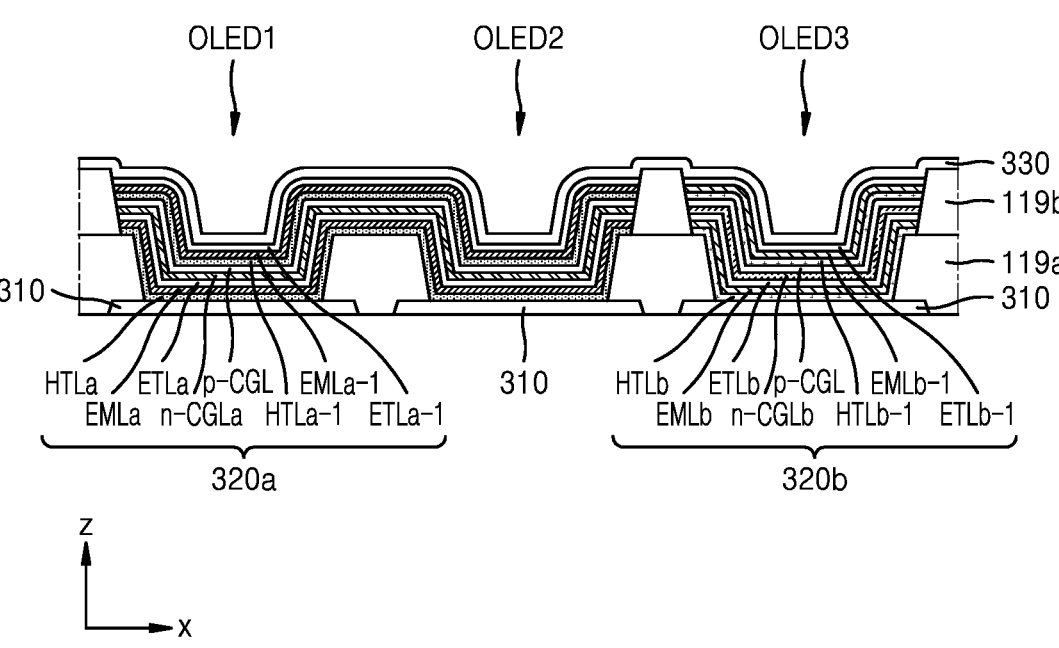
FIGS. 10 and 11 are cross-sectional views schematically illustrating part of a display apparatus according to one or more embodiments.
Figure 11:
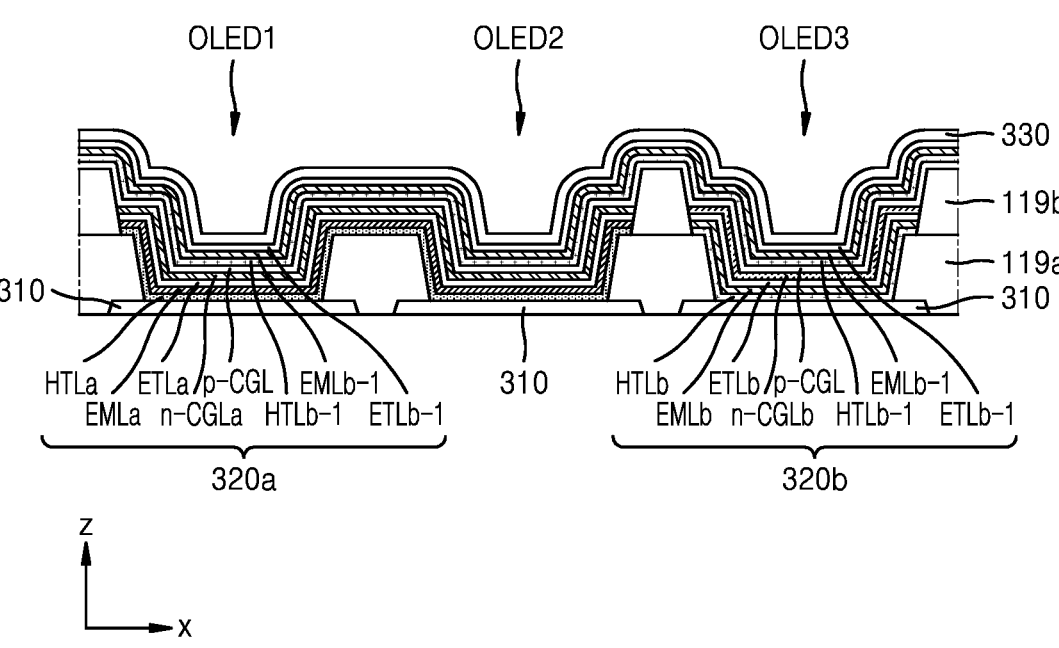

FIGS. 10 and 11 are cross-sectional views schematically illustrating part of a display apparatus according to one or more embodiments. In FIGS. 10 and 11, the same reference symbols as those of FIG. 4 denote the same, and redundant descriptions thereof will be omitted for ease in explanation of the embodiment.

Referring to FIGS. 4 and 10, the emission area EA of the first to third organic light-emitting diodes OLED1, OLED2, and OLED3 may be determined by the openings OP of the pixel-defining layer 119a. In an embodiment, the bank 119b may be arranged on the pixel-defining layer 119a.

The first and second intermediate layers 320a and 320b of the first to third organic light-emitting diodes OLED1, OLED2, and OLED3 may be provided by stacking a plurality of emission layers. For example, the first intermediate layer 320a of the first organic light-emitting diode OLED1 and the second organic light-emitting diode OLED2 may include the first emission layer EMLa and the $(1\text{-}1)^{st}$ emission layer EMLa-1, and the second intermediate layer 320b of the third organic light-emitting diode OLED3 may include the second emission layer EMLb and the $(2\text{-}1)^{st}$ emission layer EMLb-1.

The first hole transport layer HTLa may be arranged below the first emission layer EMLa, and the first electron transport layer ETLa may be arranged above the first emission layer EMLa. The $(1\text{-}1)^{st}$ hole transport layer HTLa-1 may be arranged under the $(1\text{-}1)^{st}$ emission layer EMLa-1, and the $(1\text{-}1)^{st}$ electron transport layer ETLa-1 may be arranged above the $(1\text{-}1)^{st}$ emission layer EMLa-1. The first n-type charge generation layer n-CGLa may be arranged above the first electron transport layer ETLa, and the p-type charge generation layer p-CGL may be arranged above the first n-type charge generation layer n-CGLa.

The second hole transport layer HTLb may be arranged below the second emission layer EMLb, and the second electron transport layer ETLb may be arranged above the second emission layer EMLb. The $(2\text{-}1)^{st}$ hole transport layer HTLb-1 may be arranged below the $(2\text{-}1)^{st}$ emission layer EMLb-1, and the $(2\text{-}1)^{st}$ electron transport layer ETLb-1 may be arranged above the $(2\text{-}1)^{st}$ emission layer EMLb-1. The second n-type charge generation layer n-CGLb may be arranged above the second electron transport layer ETLb, and the p-type charge generation layer p-CGL may be arranged on the second n-type charge generation layer n-CGLb.

In an embodiment, the bank 119b arranged on the pixel-defining layer 119a may separate (disconnect) the first emission layer EMLa included in the first organic light-emitting diode OLED1 and the second organic light-emitting diode OLED2 from the second emission layer EMLb included in the third organic light-emitting diode OLED3. In addition, the bank 119b may separate (disconnect) the $(1\text{-}1)^{st}$ emission layer EMLa-1 included in the first organic light-emitting diode OLED1 and the second organic light-emitting diode OLED2 from the $(2\text{-}1)^{st}$ emission layer EMLb-1 included in the third organic light-emitting diode OLED3. In an embodiment, each of the first emission layer EMLa and $(1\text{-}1)^{st}$ emission layer EMLa-1 may include an organic material emitting green light, and each of the second emission layer EMLb and the $(2\text{-}1)^{st}$ emission layer EMLb-1 may include an organic material emitting blue light.

In some embodiments, as shown in FIG. 11, the p-type charge generation layer p-CGL, the $(2\text{-}1)^{st}$ hole transport layer HTLb-1, the $(2\text{-}1)^{st}$ emission layer EMLb-1, and the $(2\text{-}1)^{st}$ electron transport layer ETLb-1 may be provided as a single body with the first intermediate layer 320a and the second intermediate layer 320b. Meanwhile, the first hole transport layer HTLa and the second hole transport layer HTLb, the first emission layer EMLa and the second emission layer EMLb, and the first electron transport layer ETLa and the second electron transport layer ETLb may be separated (disconnected) from each other by the bank 119b. In an embodiment, the first emission layer EMLa may include an organic material emitting green light, and each of the second emission layer EMLb and the $(2\text{-}1)^{st}$ emission layer EMLb-1 may include an organic material emitting blue light.

As described above, in the display apparatus according to the embodiments of the present disclosure, emission layers and charge generation layers of a first sub-pixel and a second sub-pixel are applied differently from an emission layer and charge generation layer of a third sub-pixel, and thus, the power consumption is reduced and the lifespan of the organic light-emitting diode may increase.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising a first sub-pixel, a second sub-pixel, and a third sub-pixel emitting light of different colors, the display apparatus comprising:

a first organic light-emitting diode, a second organic light-emitting diode, and a third organic light-emitting diode arranged on a substrate and corresponding to the first sub-pixel, the second sub-pixel, and the third sub-pixel, respectively;

a first intermediate layer commonly provided in the first organic light-emitting diode and the second organic light-emitting diode and comprising a first emission layer and a first charge generation layer;

a second intermediate layer provided in the third organic light-emitting diode and comprising a second emission layer and a second charge generation layer;

a first color conversion layer, a second color conversion layer, and a transmission layer arranged to correspond to the first organic light-emitting diode, the second organic light-emitting diode, and the third organic light-emitting diode, respectively; and a bank arranged on the substrate between the first emission layer and the second emission layer to space the second emission layer from the first emission layer, wherein the first emission layer emits light of a different color from the second emission layer, the first charge generation layer comprises a first material, and the second charge generation layer comprises a second material different from the first material, wherein, in a plan view, the bank surrounds around an entire periphery of the second emission layer, the bank is located between the second organic light-emitting diode and the third organic light-emitting diode, and the bank is not located between the first organic light-emitting diode and the second organic light-emitting diode, wherein the first charge generation layer in the first organic light-emitting diode and the second organic light-emitting diode comprises a host doped with the first material, and wherein the second charge generation layer in the third organic light-emitting diode comprises a host doped with the second material different than the first material, and wherein the first charge generation layer and the second charge generation layer do not overlap each other in a thickness direction of the substrate.

2. The display apparatus of claim 1, wherein the first charge generation layer is an n-type charge generation layer and the second charge generation layer is an n-type charge generation layer, wherein, in the first n-type charge generation layer, the host is doped with 0.5% to 20% of the first material, and in the second n-type charge generation layer, the host is doped with 0.5% to 20% of the second material.

3. The display apparatus of claim 2, wherein the second material has a shallower work function than the first material.

4. The display apparatus of claim 3, wherein each of the first material and the second material has a work function of 2.0 eV to 3.0 eV.

5. The display apparatus of claim 4, wherein the first material comprises at least one of ytterbium (Yb), calcium (Ca), terbium (Tb), and cerium (Ce), and the second material comprises at least one of lithium (Li), potassium (K), rubidium (Rb), cesium (Cs), barium (Ba), europium (Eu), sodium (Na), strontium (Sr), and samarium (Sm).

6. The display apparatus of claim 1, wherein the first emission layer emits green light, and the second emission layer emits blue light.

7. The display apparatus of claim 1, wherein the bank is arranged over an upper portion of a pixel-defining layer and is arranged to surround the third organic light-emitting diode, and wherein the upper portion of the pixel-defining layer defines an emission area of the first to third organic light-emitting diodes.

8. The display apparatus of claim 1, wherein the second intermediate layer further comprises a second intermediate emission layer above or below the second emission layer.

9. The display apparatus of claim 8, wherein the first intermediate layer comprises the second intermediate emission layer.

10. The display apparatus of claim 9, wherein the second intermediate emission layer and the second emission layer emit light of a same color.

11. The display apparatus of claim 8, wherein the first intermediate layer further comprises a first intermediate emission layer above or below the first emission layer, and the first intermediate emission layer and the first emission layer emit light of a same color.

12. The display apparatus of claim 1, further comprising a first color filter, a second color filter, and a third color filter corresponding to the first color conversion layer, the second color conversion layer, and the transmission layer, respectively.

13. The display apparatus of claim 12, wherein a thickness of the transmission layer is about 1 μm to about 12 μm, and a thickness of the third color filter is about 0.5 μm to about 5 μm.

14. The display apparatus of claim 12, wherein a thickness of the first color conversion layer and the second color conversion layer is about 2 μm to about 18 μm.

15. The display apparatus of claim 14, wherein the first color conversion layer comprises scattering particles, and a content of the scattering particles in the first color conversion layer is about 2% to about 10%.

16. The display apparatus of claim 12, wherein the first color conversion layer comprises first quantum dots, and a content of the first quantum dots in the first color conversion layer is about 10% to about 60%.

17. The display apparatus of claim 1, wherein the first organic light-emitting diode, the second organic light-emitting diode, and the third organic light-emitting diode comprises a first sub-pixel electrode, a second sub-pixel electrode, and a third sub-pixel electrode, respectively.

18. The display apparatus of claim 17, further comprising an opposite electrode commonly provided in the first organic light-emitting diode, the second organic light-emitting diode, and the third organic light-emitting diode.

19. A display apparatus comprising a first sub-pixel, a second sub-pixel, and a third sub-pixel emitting light of different colors, the display apparatus comprising:

a first organic light-emitting diode, a second organic light-emitting diode, and a third organic light-emitting diode arranged on a substrate and corresponding to the first sub-pixel, the second sub-pixel, and the third sub-pixel, respectively;

a first intermediate layer commonly provided in the first organic light-emitting diode and the second organic light-emitting diode and comprising a first emission layer and a first charge generation layer;

a second intermediate layer provided in the third organic light-emitting diode, the second intermediate layer comprising a second emission layer emitting light of a different color from the first emission layer, and a second charge generation layer; and a bank surrounding around an entire periphery of the second intermediate layer in a plan view to space the second emission layer from the first emission layer, wherein, in a plan view, the bank is located between the second organic light-emitting diode and the third organic light-emitting diode, and the bank is not located between the first organic light-emitting diode and the second organic light-emitting diode, wherein the first charge generation layer in the first organic light-emitting diode and the second organic light-emitting diode comprises a host doped with a first material, and wherein the second charge generation layer in the third organic light-emitting diode comprises a host doped with a second material different than the first material, and wherein the first charge generation layer and the second charge generation layer do not overlap each other in a thickness direction of the substrate.

* * * * *